US009591757B2

(12) United States Patent
Salzman et al.

(10) Patent No.: US 9,591,757 B2
(45) Date of Patent: Mar. 7, 2017

(54) PRINTED CIRCUIT BOARD ASSEMBLY FOR A GAMING MACHINE

(71) Applicant: WMS Gaming Inc., Waukegan, IL (US)

(72) Inventors: Scot W. Salzman, Buffalo Grove, IL (US); Jeremy K. Gill, Chicago, IL (US)

(73) Assignee: Bally Gaming, Inc., Las Vegas, NV (US)

( * ) Notice: Subject to any disclaimer, the term of this patent is extended or adjusted under 35 U.S.C. 154(b) by 210 days.

(21) Appl. No.: 14/498,039

(22) Filed: Sep. 26, 2014

(65) Prior Publication Data

US 2015/0282319 A1 Oct. 1, 2015

Related U.S. Application Data

(63) Continuation-in-part of application No. 14/231,102, filed on Mar. 31, 2014.

(51) Int. Cl.
*G01R 31/14* (2006.01)
*H05K 1/14* (2006.01)
(Continued)

(52) U.S. Cl.
CPC .............. *H05K 1/141* (2013.01); *G09G 1/00* (2013.01); *H01L 21/00* (2013.01); *H05K 1/142* (2013.01); *H05K 3/366* (2013.01); *H05K 3/368* (2013.01); *H05K 999/00* (2013.01); *H05K 2201/09145* (2013.01); *H05K 2201/10189* (2013.01); *H05K 2201/10446* (2013.01); *H05K 2201/2072* (2013.01)

(58) Field of Classification Search
CPC ....... H01L 21/00; H01L 2221/00; G09G 1/00; G09G 2230/00; H05K 1/00; H05K 2201/00; H05K 999/00
See application file for complete search history.

(56) References Cited

U.S. PATENT DOCUMENTS 5,355,489 A * 10/1994 Bealkowski .......... G06F 13/409
713/2
5,430,608 A * 7/1995 Honda .................. G06F 1/1616
174/377

(Continued)

*Primary Examiner* — Jermele M Hollington
*Assistant Examiner* — Temilade Rhodes-Vivour
(74) *Attorney, Agent, or Firm* — Nixon Peabody LLP

(57) ABSTRACT

A gaming system includes a backplane and one or two additional PCBs that plug into the backplane. A first PCB includes a CPU and three PCIe edge connectors that plug into corresponding sockets on the backplane. One connector separates power and ground on either side of the connector's key. Another connector carries high-speed differential video signal pairs separated by ground to video ports on the backplane. The third connector carries CPU-related signals and at least one signal specific to a gaming machine housing the backplane. An optional second PCB plugs into the first PCB and backplane and provides gaming I/O functionality. The second PCB features a repurposed PCIe connector in which the first upper and last lower pin need to be activated to place the second PCB in operation. The first and second PCBs lack any connectors that receive external cables. Cable connections inside the gaming machine are made on the backplane.

28 Claims, 28 Drawing Sheets

(51) Int. Cl.
*H01L 21/00* (2006.01)
*G09G 1/00* (2006.01)
*H05K 3/36* (2006.01)

(56) References Cited

U.S. PATENT DOCUMENTS

| | | | | |
|---|---|---|---|---|
| 8,638,838 B1* | 1/2014 | Betts | ............... | H04L 5/16 |
| | | | | 326/30 |
| 2005/0174729 A1* | 8/2005 | Chu | ............... | G06F 1/12 |
| | | | | 361/679.08 |
| 2011/0110631 A1* | 5/2011 | Baker | ............ | G02B 6/4292 |
| | | | | 385/88 |
| 2014/0301052 A1* | 10/2014 | Chen | ............... | H05K 3/32 |
| | | | | 361/760 |

* cited by examiner

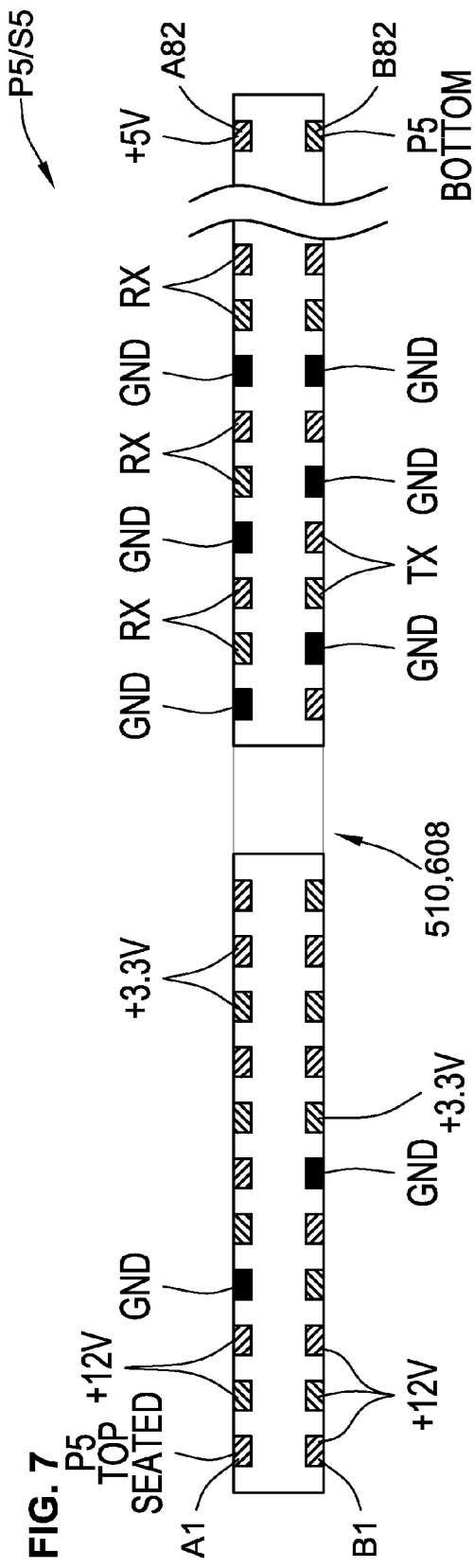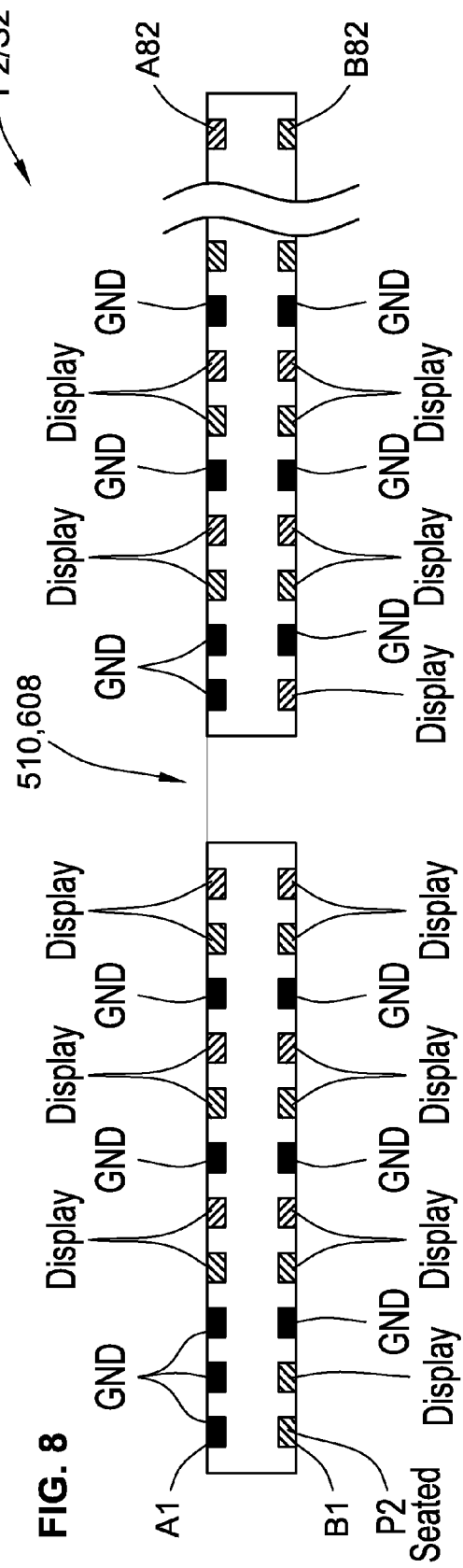

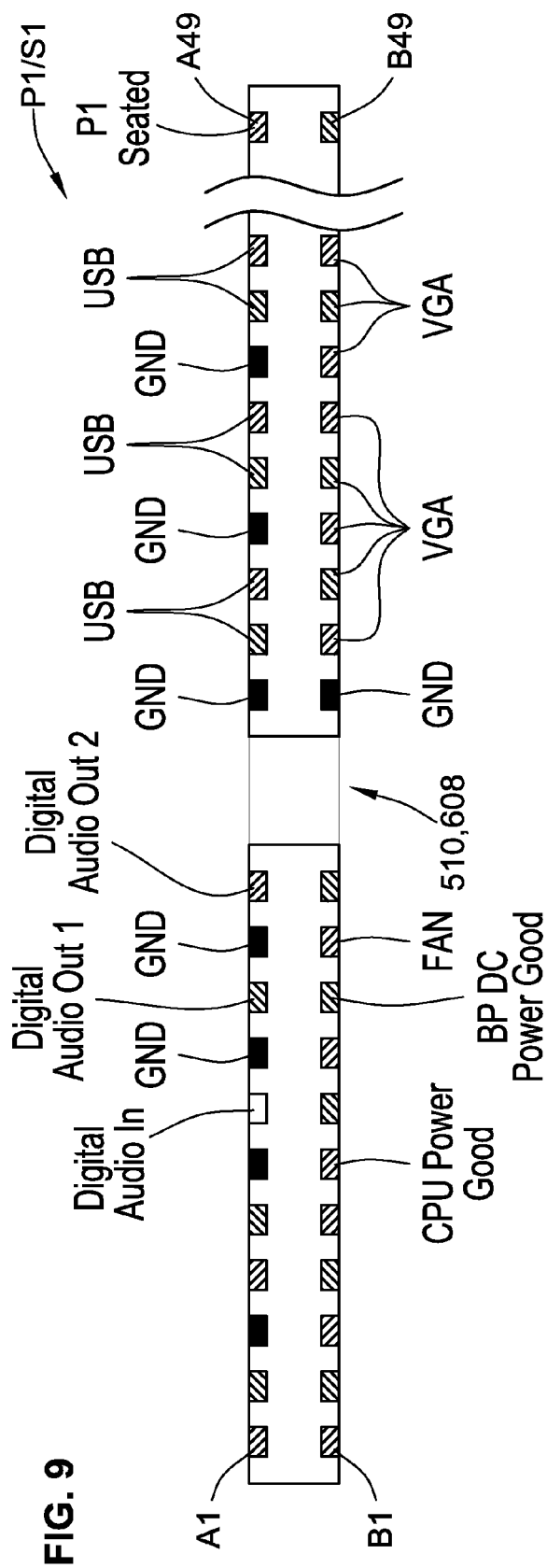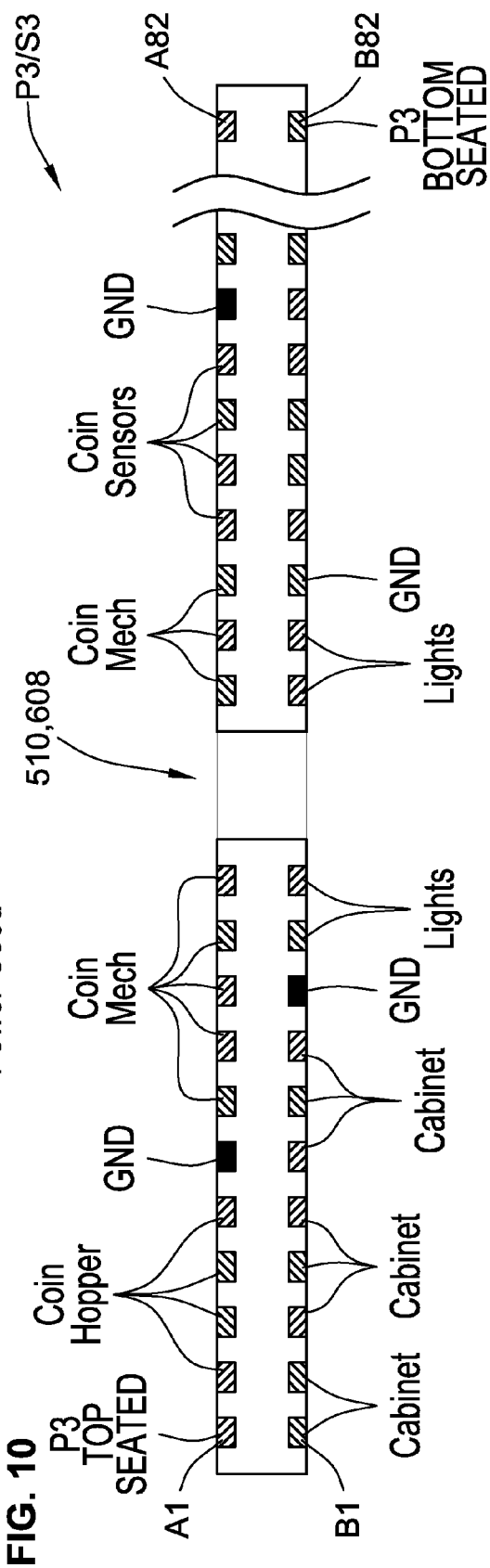

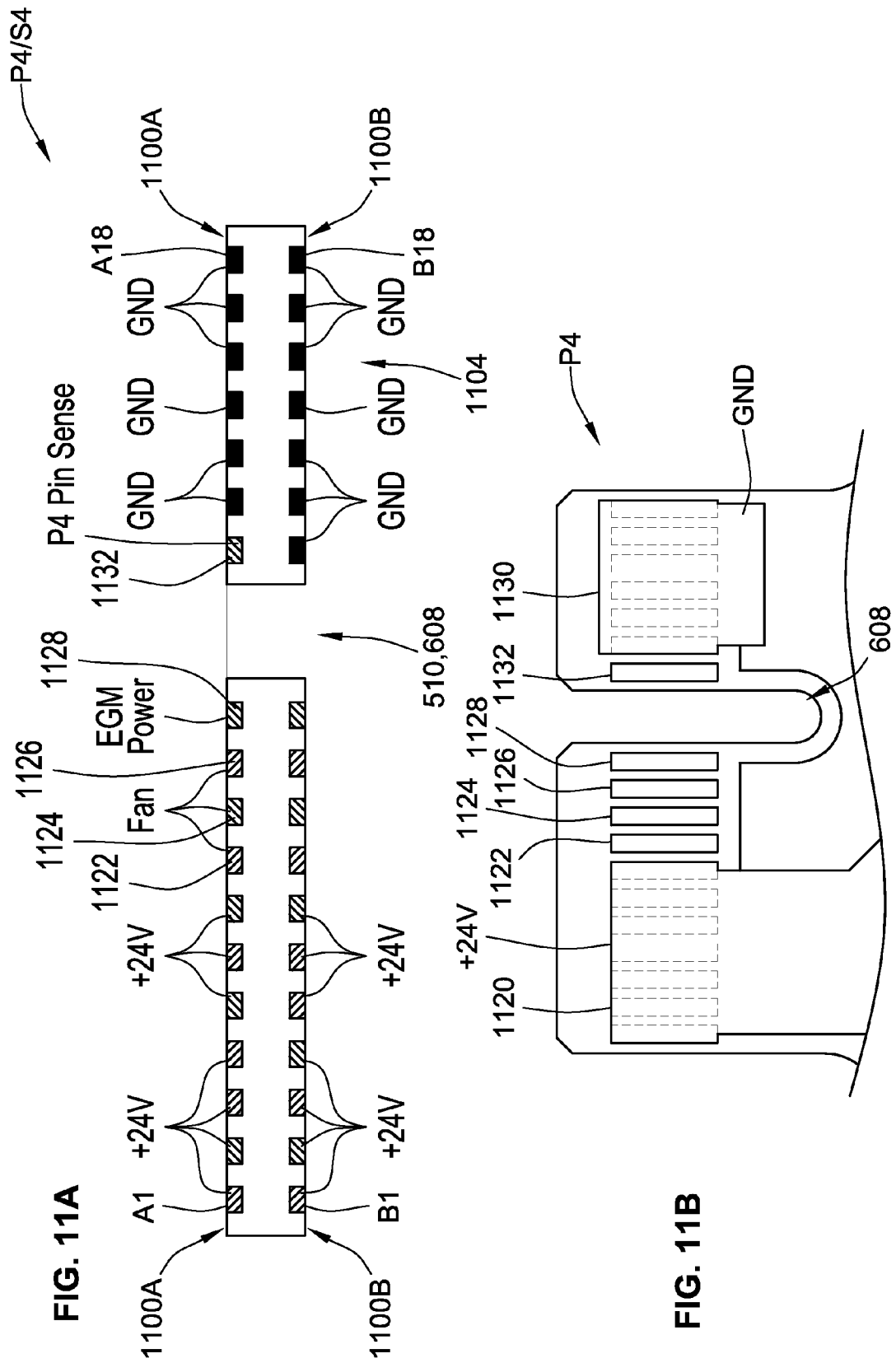

FIG. 32
 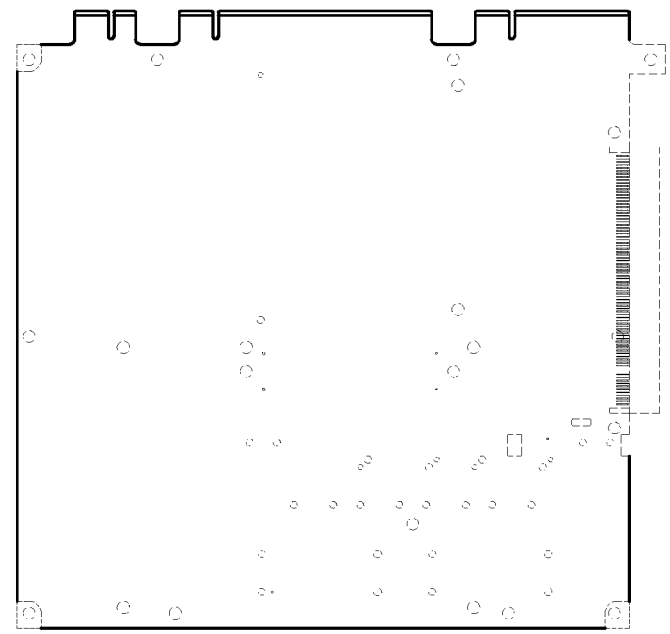 
FIG. 33  FIG. 34  FIG. 35
FIG. 36
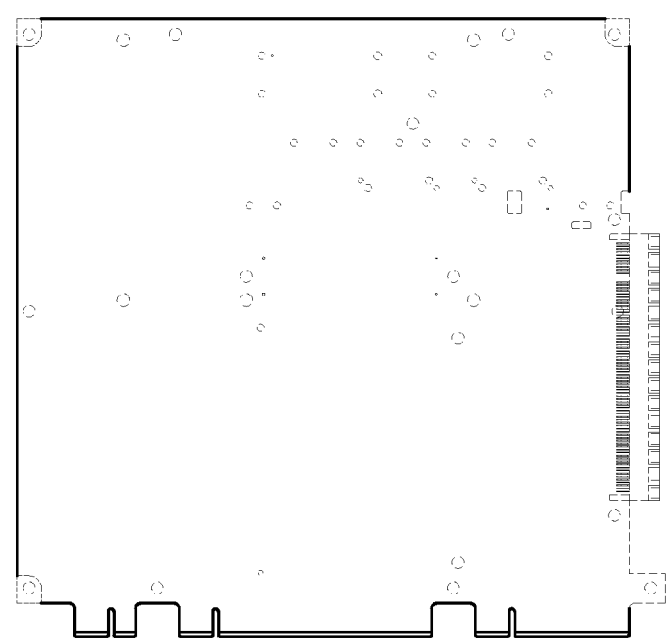
FIG. 37

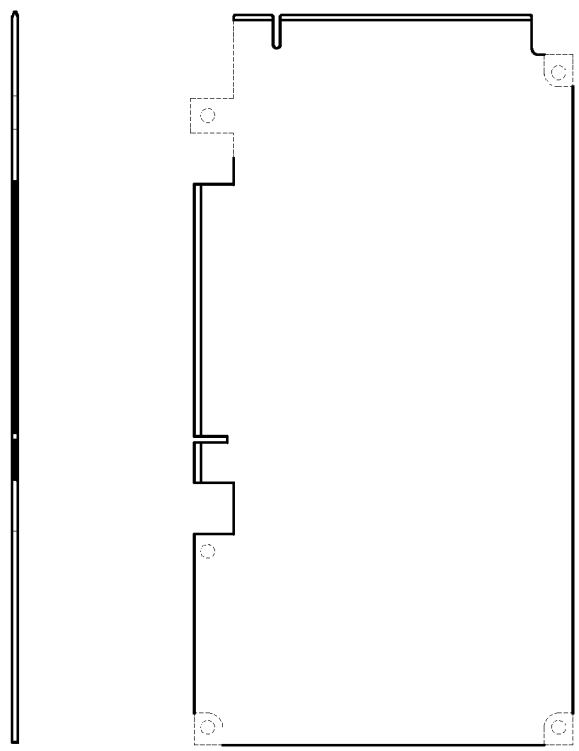
FIG. 39
FIG. 40 FIG. 41
FIG. 42
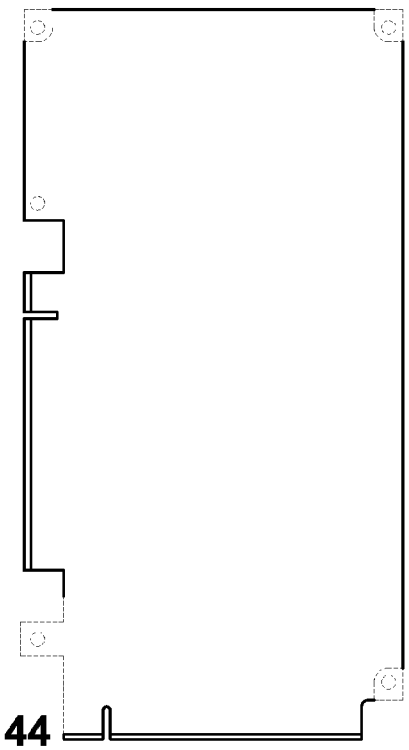
FIG. 43
FIG. 44

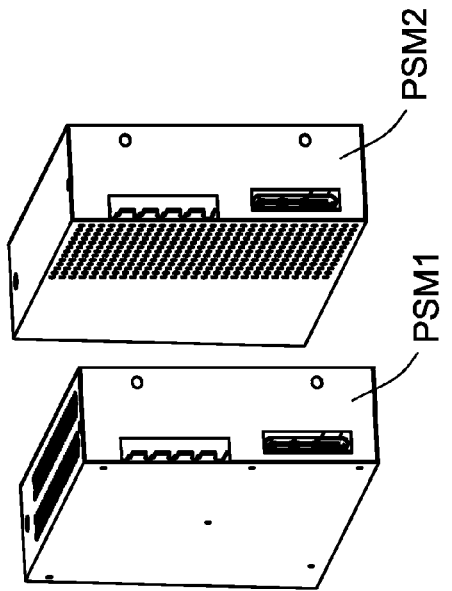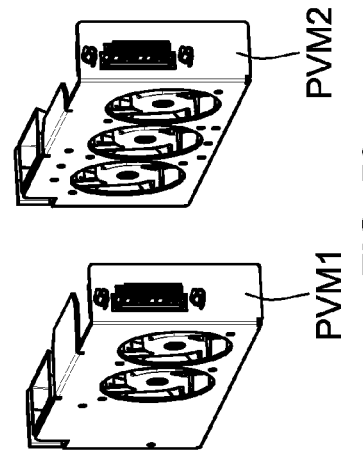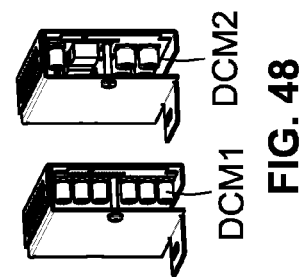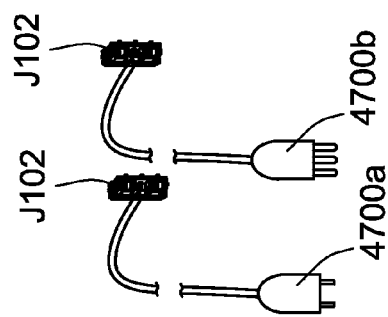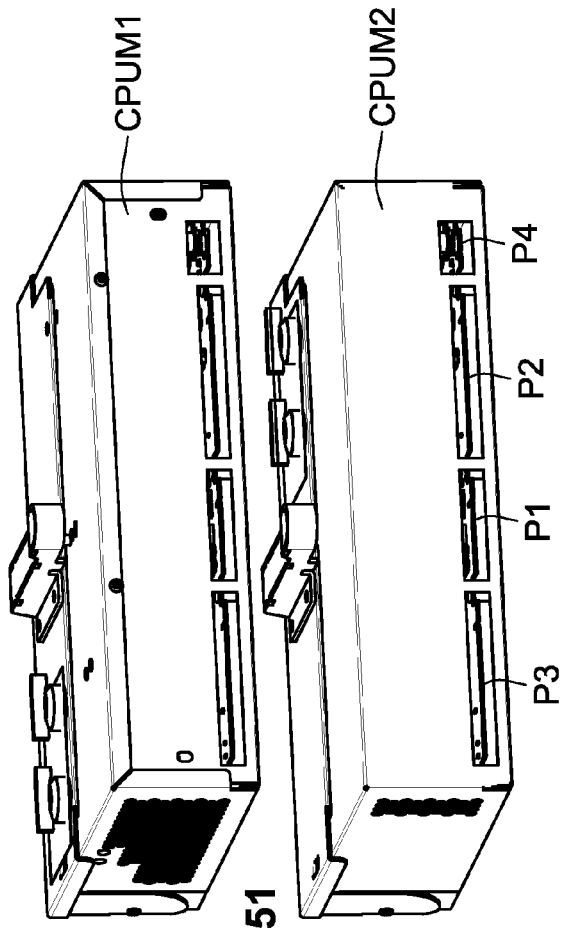

PRINTED CIRCUIT BOARD ASSEMBLY FOR A GAMING MACHINE

CROSS-REFERENCE TO RELATED APPLICATIONS

This application is a continuation-in-part of U.S. patent application Ser. No. 14/231,102, filed Mar. 31, 2014, entitled "Controlling Gaming Machine Power-Up", the entire contents of which are hereby incorporated by reference.

COPYRIGHT

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE PRESENT DISCLOSURE

Aspects of the present disclosure relate generally to gaming apparatus and methods and, more particularly, to printed circuit board assemblies for a gaming machine.

BACKGROUND

Gaming machines, such as slot machines, video poker machines and the like, have been a cornerstone of the gaming industry for several years. Generally, the popularity of such machines with players is dependent on the likelihood (or perceived likelihood) of winning money at the machine and the intrinsic entertainment value of the machine relative to other available gaming options. Where the available gaming options include a number of competing machines and the expectation of winning at each machine is roughly the same (or believed to be the same), players are likely to be attracted to the most entertaining and exciting machines. Shrewd operators consequently strive to employ the most entertaining and exciting machines, features, and enhancements available because such machines attract frequent play and hence increase profitability to the operator. Therefore, there is a continuing need for gaming machine manufacturers to continuously develop new games and improved gaming enhancements that will attract frequent play through enhanced entertainment value to the player.

SUMMARY

According to an aspect of the present disclosure, a printed circuit board (PCB) having a long edge next to a short edge is disclosed. The PCB includes a central processing unit (CPU) device (30); a power edge connector (P4) on the long edge at a corner section (604) of the PCB, the power edge connector having a key notch (608) and a plurality of consecutively arranged power connections along an upper side (1100A) and a lower side (1100B) opposite the upper side of the power edge connector on one side of the key notch (1102), the power edge connector having a plurality of consecutively arranged ground connections along the lower side and the upper side of the power edge connector on the other side of the key notch (1104). The PCB further includes a display edge connector (P2) on the long edge (602) next to the power edge connector (P4), the display edge connector having a plurality of differential pairs of differential connections physically arranged on the display edge connector such that at least one ground connection exists between adjacent differential pairs of differential connections, each of the differential pairs being configured to carry a video signal to one of a plurality of video ports (502) external to the PCB. The PCB further includes an I/O edge connector (P1) on the long edge (602) next to the display edge connector (P2) at an opposite corner section (606) of the printed circuit board, the I/O edge connector having a plurality of connections connected to respective traces leading to respective pins of the CPU.

The PCB can further include a PCB connector socket (P5) on the short edge (600) of the PCB, the PCB connector socket (S5) having a plurality of pins arranged in two rows, where a first pin of the plurality of pins on one of the two rows and a last pin of the plurality of pins on the other of the two rows are both required to be in an active state to indicate that an edge connector of an external board has been properly seated into the PCB connector socket, and where the CPU is programmed to communicate via an intermediate pin of the plurality of pins a door signal related to a status of a door of an electronic gaming machine that houses the PCB.

The PCB connector socket can be a 16-lane Peripheral Component Interconnect Express (PCIe) x16 socket, and the first and last pins can correspond to the first and 164th pin of the PCIe x16 socket. The first 98 pins of the 164 pins of the PCIe x16 socket, except for the first pin, can be configured to carry signals as defined by the PCIe x8 bus standard, and the intermediate pin can be one of the latter 66 pins of the PCIe x16 socket.

The PCB can have exactly three edge connectors, namely the power edge connector, the display edge connector, and the I/O edge connector, and can have exactly one socket connector of a type that receives a corresponding edge connector, namely the PCB connector socket. The number of differential pairs of differential connections can support up to three, or up to four, or up to five, or up to six, or up to seven, or up to eight, or up to nine video ports external to the PCB.

The power edge connector, the display edge connector, and the I/O edge connector can be Peripheral Component Interconnect Express (PCIe) type connectors. Specifically, the power edge connector can be a one-lane PCIe x1 connector, the display edge connector can be a 16-lane PCIe x16 connector, and the I/O edge connector can be an 8-lane PCIe x8 connector.

The at least one ground connection between the adjacent differential pairs of differential connections can provide a return for current passing through the differential connections and electrical isolation between the adjacent differential pairs of differential connections, and the differential connections can support high-speed signals oscillating on the order of multiple Gigahertz.

The PCB can lack on a major planar surface thereof any socket connectors that receive corresponding cable connectors connected to a cable that extends outside of a box housing the PCB, and can be plug-and-play. The PCB can have exactly three edge connectors, namely the power edge connector, the display edge connector, and the I/O edge connector. Or, the PCB can have exactly four edge connectors, namely the power edge connector, the display edge connector, the I/O edge connector, and a backplane edge connector. The backplane edge connector can have multiple backplane connections to carry corresponding low-speed signals between the PCB and a respective plurality of hardware components of an electronic gaming machine that houses the PCB via a backplane having a corresponding backplane socket connector to receive the backplane edge connector.

According to another aspect of the present disclosure, a printed circuit board (PCB) includes a backplane edge connector (P3) having multiple backplane connections to carry corresponding low-speed signals between the PCB and a respective plurality of hardware components of an electronic gaming machine that houses the PCB via a backplane having a corresponding backplane socket connector (S3) to receive the backplane edge connector. The PCB further includes an edge connector (P5) having a plurality of connections arranged in two rows, where a first connection of the plurality of connections on one of the two rows and a last connection of the plurality of connections on the other of the two rows are both required to be in an active state to indicate that the edge connector has been properly seated into a PCB connector socket (S5) of an external printed circuit board (CB), and where an intermediate connection of the plurality of connections carries a door signal related to a status of a door of the electronic gaming machine.

The PCB can have a first edge perpendicular to a second edge. The backplane edge connector (P3) can extend from the first edge, and the edge connector (P5) can extend from the second edge. The edge connector can be a 16-lane Peripheral Component Interconnect Express (PCIe) x16 edge connector. The first and last connection of the connections can correspond to the first and 164th connection of the PCIe x16 edge connector, respectively.

Each of the first 98 connections of the 164 connections of the PCIe x16 edge connector, except for the first connection, can be configured to carry corresponding signals as defined by the PCIe x8 bus standard. The intermediate connection can be one of the latter 66 connections of the PCIe x16 edge connector.

The hardware components can include any two or more of a coin interface, coin-in meter, a coin-out meter, one or more lights in a top box of a cabinet of the electronic gaming machine, one or more monitored doors of the electronic gaming machine, a slot arm, a slot arm lock, or one or more key switches.

The backplane connections can include cabinet-type connections that indicate a type of cabinet of the electronic gaming machine. The backplane connections can alternately or additionally include serial connections for one or more serial ports. The backplane connections can include door-status connections that indicate a status of one of the one or more monitored doors. The backplane connections can include coin-interface connections that indicate information about or control the coin interface. The backplane connections can include connections for security logic control associated with security of the electronic gaming machine.

The backplane connections can include meter-status connections indicating whether the coin-in meter or the coin-out meter is operating abnormally or non-functioning. The PCB can lack on a major planar surface thereof any socket connectors that receive corresponding cable connectors connected to a cable, and can be plug-and-play.

According to yet another aspect of the present disclosure, a printed circuit board (PCB) assembly includes a backplane PCB having a first edge (504) next to a second edge (506). The backplane PCB includes a power connector socket (S4) on the first edge at a corner section of the backplane PCB. The power connector socket has a key and consecutively arranged power pins along an upper side and a lower side opposite the upper side of the power edge socket on one side of the key. The power connector socket has consecutively arranged ground connections along the lower side and the upper side of the power connector socket on the other side of the key.

The backplane PCB further includes a display connector socket (S2) on the first edge next to the power connector socket, the display connector socket having a plurality of differential pairs of differential pins physically arranged on the display connector socket such that at least one ground pin exists between adjacent differential pairs of differential pins, each of the differential pairs being configured to carry a video signal to a corresponding one of a plurality of video ports on the backplane PCB. The backplane PCB further includes an I/O connector socket (S1) on the first edge next to the display connector socket at an opposite corner section of the backplane PCB. The I/O connector socket has pins connected to respective traces leading to respective pins of a CPU on an external backplane PCB. The backplane PCB further includes a backplane connector socket (S3) having backplane pins to carry corresponding low-speed signals between the backplane PCB and a respective hardware components of an electronic gaming machine that houses the backplane PCB.

The PCB can further include an AC power connector having power contacts to receive an AC power cable carrying respective hot, neutral, and ground relative to an AC power source external to the PCB assembly. The PCB can further include an AC power connector and a DC power connector having power contacts to receive respective DC power and ground relative to a DC power source. The DC power connector further includes signal contacts to receive at least status signals indicative of a status of the DC power source or another power source or both. The AC power connector can be of a receptacle header type.

According to still another aspect of the present disclosure, a printed circuit board assembly (PCBA) includes a first printed circuit board (PCB) having a long edge (602) next to a short edge (600). The first PCB includes a central processing unit (CPU) device (30) and a power edge connector (P4) on the long edge at a corner section (604) of the first PCB. The power edge connector has a key notch (608) and consecutively arranged power connections along an upper side (1100A) and a lower side (1100B) opposite the upper side of the power edge connector on one side of the key notch (1102). The power edge connector has consecutively arranged ground connections along the lower side and the upper side of the power edge connector on the other side of the key notch (1104). The first PCB further includes a display edge connector (P2) on the long edge (602) next to the power edge connector (P4). The display edge connector has differential pairs of differential connections physically arranged on the display edge connector such that at least one ground connection exists between adjacent differential pairs of differential connections. Each of the differential pairs is configured to carry a video signal to a corresponding video port (502) external to the first PCB. The first PCB further includes an I/O edge connector (P1) on the long edge (602) next to the display edge connector (P2) at an opposite corner section (606) of the printed circuit board. The I/O edge connector has connections connected to respective traces leading to respective pins of the first CPU.

The PCBA further includes a second PCB that includes a backplane edge connector (P3) having backplane connections to carry corresponding low-speed signals between the second PCB and a respective hardware components of an electronic gaming machine that houses the second PCB via a backplane PCB having a corresponding backplane socket connector (S3) to receive the backplane edge connector. The second PCB includes an edge connector (P5) having a connections arranged in two rows. A first connection on one of the two rows and a last connection on the other of the two rows are both required to be in an active state to indicate that the edge connector has been properly seated into a PCB connector socket (S5) of the first PCB. An intermediate connection of the connections carries a door signal related to a status of a door of the electronic gaming machine.

The backplane PCB has a first backplane edge (504) next to a second backplane edge (506), including a power connector socket (S4) on the first backplane edge at a corner section of the backplane PCB. The power connector socket has a key and consecutively arranged power pins along an upper side and a lower side opposite the upper side of the power edge socket on one side of the key. The power connector socket has consecutively arranged ground connections along the lower side and the upper side of the power connector socket on the other side of the key. The backplane PCB further includes a display connector socket (S2) on the first backplane edge next to the power connector socket.

The display connector socket has differential pairs of differential pins physically arranged on the display connector socket such that at least one ground pin exists between adjacent differential pairs of differential pins. Each of the differential pairs is configured to carry a video signal to a corresponding one of a plurality of video ports on the backplane PCB. The backplane PCB further includes an I/O connector socket (S1) on the first edge next to the display connector socket at an opposite corner section of the backplane PCB. The I/O connector socket has pins connected to respective traces leading to respective pins of the CPU. The backplane connector socket has backplane pins to carry corresponding low-speed signals between the backplane PCB and the respective hardware components of the electronic gaming machine that houses the backplane PCB.

According to still another aspect of the present disclosure, the above gaming system is incorporated into a single, free-standing gaming terminal.

Additional aspects of the present disclosure will be apparent to those of ordinary skill in the art in view of the detailed description of various embodiments, which is made with reference to the drawings, a brief description of which is provided below.

BRIEF DESCRIPTION OF THE DRAWINGS

FIG. 7 is a functional diagram of some of the connections/pins found on the PCB edge/socket connector P5/S5 of the boards GB/CB shown in FIG. 5.

FIG. 8 is a functional diagram of some of the connections/pins found on the display edge connector/socket P2/S2 of the boards CB/BP shown in FIG. 5.

FIG. 9 is a functional diagram of some of the connections/pins found on the I/O edge connector/socket P1/S1 of the boards CB/BP shown in FIG. 5.

FIG. 10 is a functional diagram of some of the connections/pins found on the backplane edge connector/socket P3/S3 of the boards GB/BP shown in FIG. 5.

FIG. 11A is a functional diagram of the connections/pins found on the power edge connector/socket P4/S4 of the boards CB/BP shown in FIG. 5.

FIG. 11B is a top view (A side) of the power edge connector P4 showing conductor blades for carrying multiple power and ground connections.

FIG. 32 is a bottom end view of the PCB shown in FIG. 31.

FIG. 33 is a side end view of one end of the PCB shown in FIG. 31.

FIG. 34 is a top view of the PCB shown in FIG. 31.

FIG. 35 is a side end view of the other end of the PCB shown in FIG. 31.

FIG. 36 is a top end view of the PCB shown in FIG. 31.

FIG. 37 is a bottom view of the PCB shown in FIG. 31.

FIG. 39 is a bottom end view of the second PCB shown in FIG. 38.

FIG. 40 is a side end view of one end of the second PCB shown in FIG. 38.

FIG. 41 is a top view of the second PCB shown in FIG. 38.

FIG. 42 is a side end view of the other end of the second PCB shown in FIG. 38.

FIG. 43 is a top end view of the second PCB shown in FIG. 38.

FIG. 44 is a bottom view of the second PCB shown in FIG. 38.

FIG. 47 illustrates two different electrical cords/plugs that can be connected to the backplane BP.

FIG. 48 illustrates two different DC power supply modules that can be connected to the backplane BP.

FIG. 49 illustrates two different (AC) power supply modules that can be connected to the backplane BP.

FIG. 50 illustrates two different fan modules that can be connected to the backplane BP.

FIG. 51 illustrates two different CPU modules that can be connected to the backplane BP.

Figure 1:
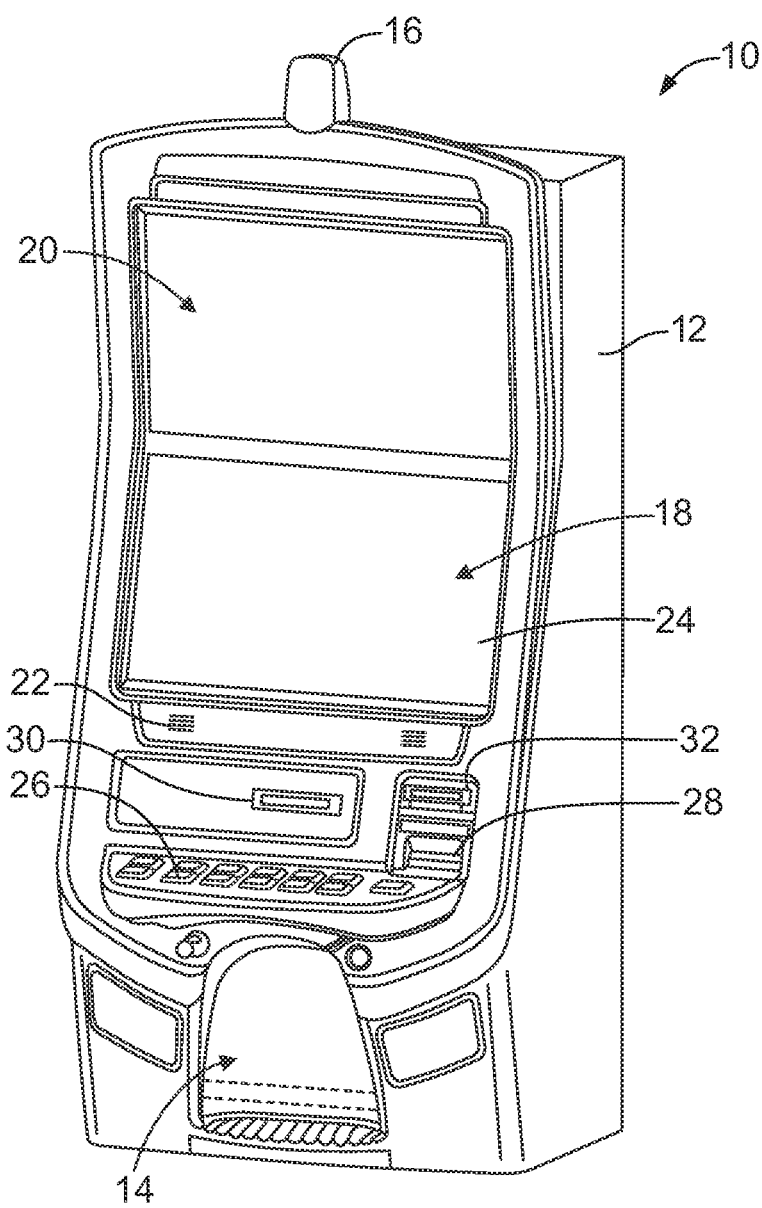
FIG. 1 is a perspective view of a free-standing gaming machine according to an embodiment of the present disclosure.

The broken lines shown in FIGS. 12-44 are only for illustrative purposes to show visible environmental structure and form no part of the claimed invention.

While the disclosure is susceptible to various modifications and alternative forms, specific embodiments have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

DETAILED DESCRIPTION

While this invention is susceptible of embodiment in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated. For purposes of the present detailed description, the singular includes the plural and vice versa (unless specifically disclaimed); the words "and" and "or" shall be both conjunctive and disjunctive; the word "all" means "any and all"; the word "any" means "any and all"; and the word "including" means "including without limitation."

For purposes of the present detailed description, the terms "wagering game," "casino wagering game," "gambling," "slot game," "casino game," and the like include games in which a player places at risk a sum of money or other representation of value, whether or not redeemable for cash, on an event with an uncertain outcome, including without limitation those having some element of skill. In some embodiments, the wagering game involves wagers of real money, as found with typical land-based or online casino games. In other embodiments, the wagering game additionally, or alternatively, involves wagers of non-cash values, such as virtual currency, and therefore may be considered a social or casual game, such as would be typically available on a social networking web site, other web sites, across computer networks, or applications on mobile devices (e.g., phones, tablets, etc.). When provided in a social or casual game format, the wagering game may closely resemble a traditional casino game, or it may take another form that more closely resembles other types of social/casual games.

Referring to FIG. 1, there is shown a gaming machine 10 similar to those operated in gaming establishments, such as casinos. With regard to the present invention, the gaming machine 10 may be any type of gaming terminal or machine and may have varying structures and methods of operation. For example, in some aspects, the gaming machine 10 is an electromechanical gaming terminal configured to play mechanical slots, whereas in other aspects, the gaming machine is an electronic gaming terminal configured to play a video casino game, such as slots, keno, poker, blackjack, roulette, craps, etc. The gaming machine 10 may take any suitable form, such as floor-standing models as shown, handheld mobile units, bartop models, workstation-type console models, etc. Further, the gaming machine 10 may be primarily dedicated for use in playing wagering games, or may include non-dedicated devices, such as mobile phones, personal digital assistants, personal computers, etc. Exemplary types of gaming machines are disclosed in U.S. Pat. Nos. 6,517,433, 8,057,303, and 8,226,459, which are incorporated herein by reference in their entireties.

The gaming machine 10 illustrated in FIG. 1 comprises a gaming cabinet 12 that securely houses various input devices, output devices, input/output devices, internal electronic/electromechanical components, and wiring. The cabinet 12 includes exterior walls, interior walls and shelves for mounting the internal components and managing the wiring, and one or more front doors that are locked and require a physical or electronic key to gain access to the interior compartment of the cabinet 12 behind the locked door. The cabinet 12 forms an alcove 14 configured to store one or more beverages or personal items of a player. A notification mechanism 16, such as a candle or tower light, is mounted to the top of the cabinet 12. It flashes to alert an attendant that change is needed, a hand pay is requested, or there is a potential problem with the gaming machine 10.

The input devices, output devices, and input/output devices are disposed on, and securely coupled to, the cabinet 12. By way of example, the output devices include a primary display 18, a secondary display 20, and one or more audio speakers 22. The primary display 18 or the secondary display 20 may be a mechanical-reel display device, a video display device, or a combination thereof in which a transmissive video display is disposed in front of the mechanical-reel display to portray a video image superimposed upon the mechanical-reel display. The displays variously display information associated with wagering games, non-wagering games, community games, progressives, advertisements, services, premium entertainment, text messaging, emails, alerts, announcements, broadcast information, subscription information, etc. appropriate to the particular mode(s) of operation of the gaming machine 10. The gaming machine 10 includes a touch screen(s) 24 mounted over the primary or secondary displays, buttons 26 on a button panel, a bill/ticket acceptor 28, a card reader/writer 30, a ticket dispenser 32, and player-accessible ports (e.g., audio output jack for headphones, video headset jack, USB port, wireless transmitter/receiver, etc.). It should be understood that numerous other peripheral devices and other elements exist and are readily utilizable in any number of combinations to create various forms of a gaming machine in accord with the present concepts.

The player input devices, such as the touch screen 24, buttons 26, a mouse, a joystick, a gesture-sensing device, a voice-recognition device, and a virtual-input device, accept player inputs and transform the player inputs to electronic data signals indicative of the player inputs, which correspond to an enabled feature for such inputs at a time of activation (e.g., pressing a "Max Bet" button or soft key to indicate a player's desire to place a maximum wager to play the wagering game). The inputs, once transformed into electronic data signals, are output to game-logic circuitry for processing. The electronic data signals are selected from a group consisting essentially of an electrical current, an electrical voltage, an electrical charge, an optical signal, an optical element, a magnetic signal, and a magnetic element.

The gaming machine 10 includes one or more value input/payment devices and value output/payout devices. The value input devices are used to deposit cash or credits onto the gaming machine 10. The cash or credits are used to fund wagers placed on the wagering game played via the gaming machine 10. Examples of value input devices include, but are not limited to, a coin acceptor, the bill/ticket acceptor 28, the card reader/writer 30, a wireless communication interface for reading cash or credit data from a nearby mobile device, and a network interface for withdrawing cash or credits from a remote account via an electronic funds transfer. The value output devices are used to dispense cash or credits from the gaming machine 10. The credits may be exchanged for cash at, for example, a cashier or redemption station. Examples of value output devices include, but are not limited to, a coin hopper for dispensing coins or tokens, a bill dispenser, the card reader/writer 30, the ticket dispenser 32 for printing tickets redeemable for cash or credits, a wireless communication interface for transmitting cash or credit data to a nearby mobile device, and a network interface for depositing cash or credits to a remote account via an electronic funds transfer.

Figure 2:
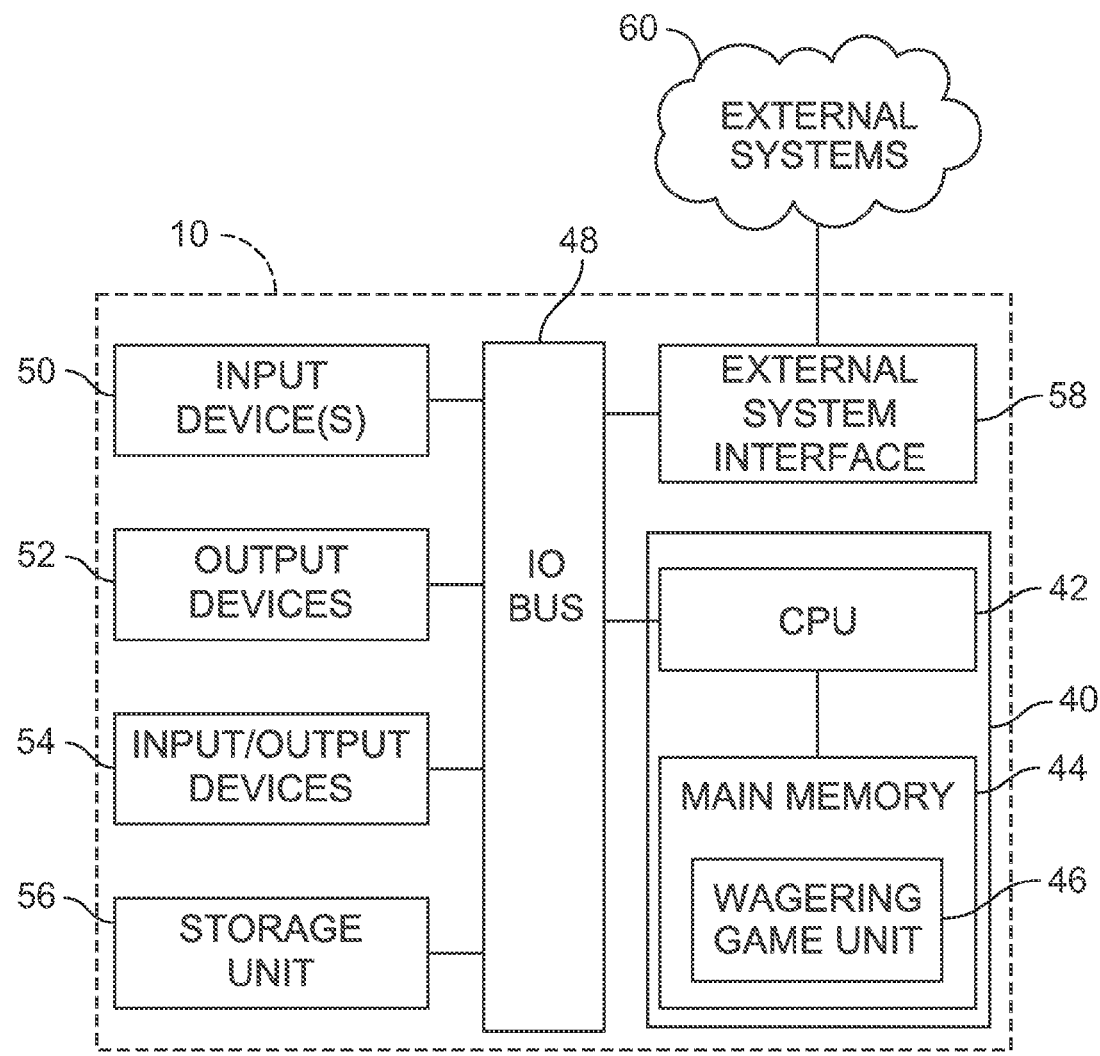
FIG. 2 is a schematic view of a gaming system according to an embodiment of the present disclosure.

Turning now to FIG. 2, there is shown a block diagram of the gaming-machine architecture. The gaming machine 10 includes game-logic circuitry 40 securely housed within a locked box inside the gaming cabinet 12 (see FIG. 1). The game-logic circuitry 40 includes a central processing unit (CPU) 42 connected to a main memory 44 that comprises one or more memory devices. The CPU 42 includes any suitable processor(s), such as those made by Intel and AMD. By way of example, the CPU 42 includes a plurality of microprocessors including a master processor, a slave processor, and a secondary or parallel processor. Game-logic circuitry 40, as used herein, comprises any combination of hardware, software, or firmware disposed in or outside of the gaming machine 10 that is configured to communicate with or control the transfer of data between the gaming machine 10 and a bus, another computer, processor, device, service, or network. The game-logic circuitry 40, and more specifically the CPU 42, comprises one or more controllers or processors and such one or more controllers or processors need not be disposed proximal to one another and may be located in different devices or in different locations. The game-logic circuitry 40, and more specifically the main memory 44, comprises one or more memory devices which need not be disposed proximal to one another and may be located in different devices or in different locations. The game-logic circuitry 40 is operable to execute all of the various gaming methods and other processes disclosed herein. The main memory 44 includes a wagering-game unit 46. In one embodiment, the wagering-game unit 46 causes wagering games to be presented, such as video poker, video black jack, video slots, video lottery, etc., in whole or part.

The game-logic circuitry 40 is also connected to an input/output (I/O) bus 48, which can include any suitable bus technologies, such as an AGTL+ frontside bus and a PCI backside bus. The I/O bus 48 is connected to various input devices 50, output devices 52, and input/output devices 54 such as those discussed above in connection with FIG. 1. The I/O bus 48 is also connected to a storage unit 56 and an external-system interface 58, which is connected to external system(s) 60 (e.g., wagering-game networks).

The external system 60 includes, in various aspects, a gaming network, other gaming machines or terminals, a gaming server, a remote controller, communications hardware, or a variety of other interfaced systems or components, in any combination. In yet other aspects, the external system 60 comprises a player's portable electronic device (e.g., cellular phone, electronic wallet, etc.) and the external-system interface 58 is configured to facilitate wireless communication and data transfer between the portable electronic device and the gaming machine 10, such as by a near-field communication path operating via magnetic-field induction or a frequency-hopping spread spectrum RF signals (e.g., Bluetooth, etc.).

The gaming machine 10 optionally communicates with the external system 60 such that the gaming machine 10 operates as a thin, thick, or intermediate client. The game-logic circuitry 40—whether located within ("thick client"), external to ("thin client"), or distributed both within and external to ("intermediate client") the gaming machine 10—is utilized to provide a wagering game on the gaming machine 10. In general, the main memory 44 stores programming for a random number generator (RNG), game-outcome logic, and game assets (e.g., art, sound, etc.)—all of which obtained regulatory approval from a gaming control board or commission and are verified by a trusted authentication program in the main memory 44 prior to game execution. The authentication program generates a live authentication code (e.g., digital signature or hash) from the memory contents and compare it to a trusted code stored in the main memory 44. If the codes match, authentication is deemed a success and the game is permitted to execute. If, however, the codes do not match, authentication is deemed a failure that must be corrected prior to game execution. Without this predictable and repeatable authentication, the gaming machine 10, external system 60, or both are not allowed to perform or execute the RNG programming or game-outcome logic in a regulatory-approved manner and are therefore unacceptable for commercial use.

When a wagering-game instance is executed, the CPU 42 (comprising one or more processors or controllers) executes the RNG programming to generate one or more pseudo-random numbers. The pseudo-random numbers are divided into different ranges, and each range is associated with a respective game outcome. Accordingly, the pseudo-random numbers are utilized by the CPU 42 when executing the game-outcome logic to determine a resultant outcome for that instance of the wagering game. The resultant outcome is then presented to a player of the gaming machine 10 by accessing the associated game assets, required for the resultant outcome, from the main memory 44. The CPU 42 causes the game assets to be presented to the player as outputs from the gaming machine 10 (e.g., audio and video presentations). Instead of a pseudo-RNG, the game outcome may be derived from random numbers generated by a physical RNG that measures some physical phenomenon that is expected to be random and then compensates for possible biases in the measurement process. Whether the RNG is a pseudo-RNG or physical RNG, the RNG uses a seeding process that relies upon an unpredictable factor (e.g., human interaction of turning a key) and cycles continuously in the background between games and during game play at a speed that cannot be timed by the player, for example, at a minimum of 100 Hz (100 calls per second) as set forth in Nevada's New Gaming Device Submission Package. Accordingly, the RNG cannot be carried out manually by a human.

The gaming machine 10 may be used to play central determination games, such as electronic pull-tab and bingo games. In an electronic pull-tab game, the RNG is used to randomize the distribution of outcomes in a pool and/or to select which outcome is drawn from the pool of outcomes when the player requests to play the game. In an electronic bingo game, the RNG is used to randomly draw numbers that players match against numbers printed on their electronic bingo card.

The gaming machine 10 may include additional peripheral devices or more than one of each component shown in FIG. 2. Any component of the gaming-machine architecture includes hardware, firmware, or tangible machine-readable storage media including instructions for performing the operations described herein. Machine-readable storage media includes any mechanism that stores information and provides the information in a form readable by a machine (e.g., gaming terminal, computer, etc.). For example, machine-readable storage media includes read only memory (ROM), random access memory (RAM), magnetic-disk storage media, optical storage media, flash memory, etc.

Figure 3:
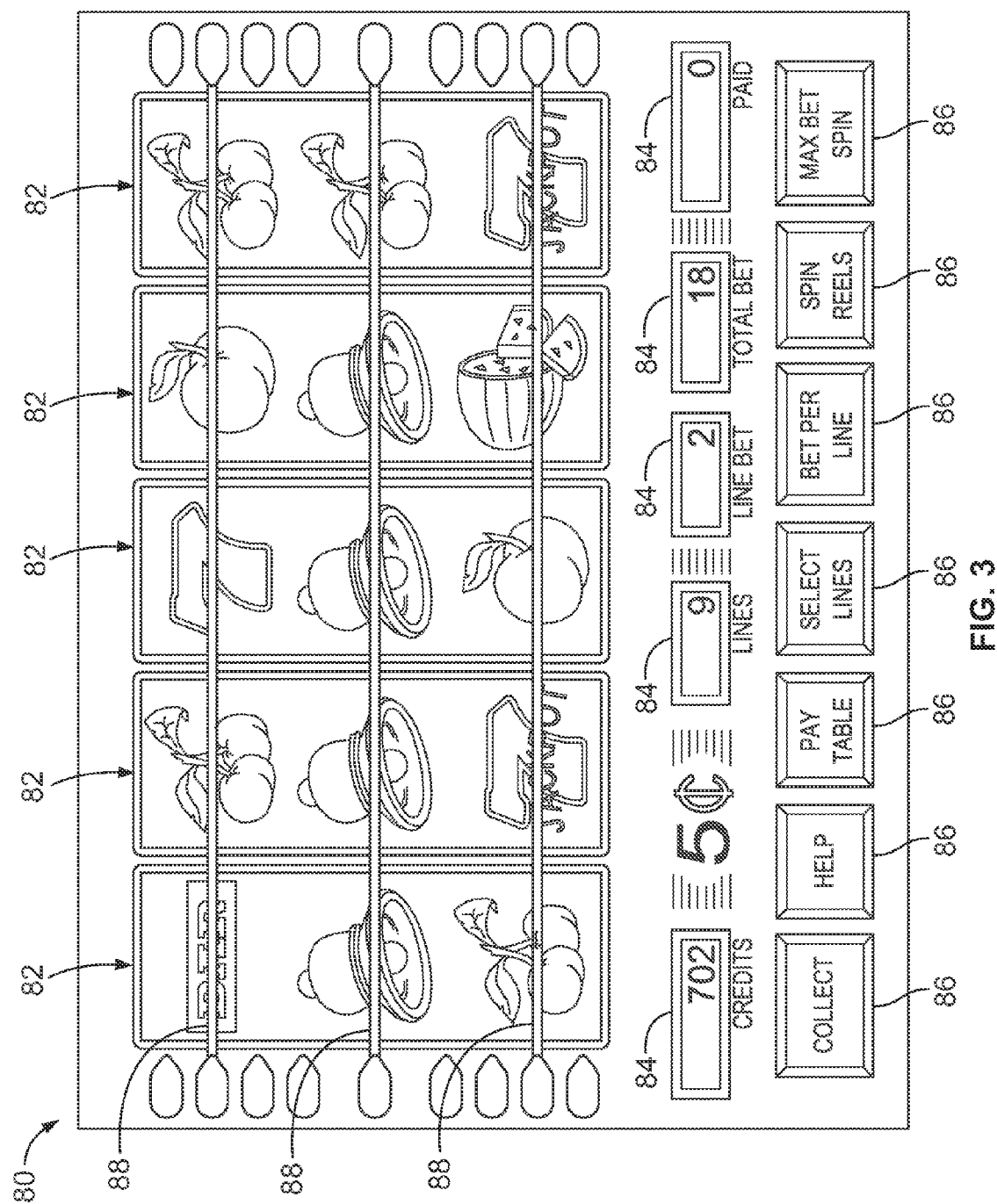
FIG. 3 is an image of an exemplary basic-game screen of a wagering game displayed on a gaming machine, according to an embodiment of the present disclosure.

Referring now to FIG. 3, there is illustrated an image of a basic-game screen 80 adapted to be displayed on the primary display 18 or the secondary display 20. The basic-game screen 80 portrays a plurality of simulated symbol-bearing reels 82. Alternatively or additionally, the basic-game screen 80 portrays a plurality of mechanical reels or other video or mechanical presentation consistent with the game format and theme. The basic-game screen 80 also advantageously displays one or more game-session credit meters 84 and various touch screen buttons 86 adapted to be actuated by a player. A player can operate or interact with the wagering game using these touch screen buttons or other input devices such as the buttons 26 shown in FIG. 1. The game-logic circuitry 40 operates to execute a wagering-game program causing the primary display 18 or the secondary display 20 to display the wagering game.

In response to receiving an input indicative of a wager, the reels 82 are rotated and stopped to place symbols on the reels in visual association with paylines such as paylines 88. The wagering game evaluates the displayed array of symbols on the stopped reels and provides immediate awards and bonus features in accordance with a pay table. The pay table may, for example, include "line pays" or "scatter pays." Line pays occur when a predetermined type and number of symbols appear along an activated payline, typically in a particular order such as left to right, right to left, top to bottom, bottom to top, etc. Scatter pays occur when a predetermined type and number of symbols appear anywhere in the displayed array without regard to position or paylines. Similarly, the wagering game may trigger bonus features based on one or more bonus triggering symbols appearing along an activated payline (i.e., "line trigger") or anywhere in the displayed array (i.e., "scatter trigger"). The wagering game may also provide mystery awards and features independent of the symbols appearing in the displayed array.

In accord with various methods of conducting a wagering game on a gaming system in accord with the present concepts, the wagering game includes a game sequence in which a player makes a wager and a wagering-game outcome is provided or displayed in response to the wager being received or detected. The wagering-game outcome, for that particular wagering-game instance, is then revealed to the player in due course following initiation of the wagering game. The method comprises the acts of conducting the wagering game using a gaming apparatus, such as the gaming machine 10 depicted in FIG. 1, following receipt of an input from the player to initiate a wagering-game instance. The gaming machine 10 then communicates the wagering-game outcome to the player via one or more output devices (e.g., primary display 18 or secondary display 20) through the display of information such as, but not limited to, text, graphics, static images, moving images, etc., or any combination thereof. In accord with the method of conducting the wagering game, the game-logic circuitry 40 transforms a physical player input, such as a player's pressing of a "Spin Reels" touch key, into an electronic data signal indicative of an instruction relating to the wagering game (e.g., an electronic data signal bearing data on a wager amount).

In the aforementioned method, for each data signal, the game-logic circuitry 40 is configured to process the electronic data signal, to interpret the data signal (e.g., data signals corresponding to a wager input), and to cause further actions associated with the interpretation of the signal in accord with stored instructions relating to such further actions executed by the controller. As one example, the CPU 42 causes the recording of a digital representation of the wager in one or more storage media (e.g., storage unit 56), the CPU 42, in accord with associated stored instructions, causes the changing of a state of the storage media from a first state to a second state. This change in state is, for example, effected by changing a magnetization pattern on a magnetically coated surface of a magnetic storage media or changing a magnetic state of a ferromagnetic surface of a magneto-optical disc storage media, a change in state of transistors or capacitors in a volatile or a non-volatile semiconductor memory (e.g., DRAM, etc.). The noted second state of the data storage media comprises storage in the storage media of data representing the electronic data signal from the CPU 42 (e.g., the wager in the present example). As another example, the CPU 42 further, in accord with the execution of the stored instructions relating to the wagering game, causes the primary display 18, other display device, or other output device (e.g., speakers, lights, communication device, etc.) to change from a first state to at least a second state, wherein the second state of the primary display comprises a visual representation of the physical player input (e.g., an acknowledgement to a player), information relating to the physical player input (e.g., an indication of the wager amount), a game sequence, an outcome of the game sequence, or any combination thereof, wherein the game sequence in accord with the present concepts comprises acts described herein. The aforementioned executing of the stored instructions relating to the wagering game is further conducted in accord with a random outcome (e.g., determined by the RNG) that is used by the game-logic circuitry 40 to determine the outcome of the wagering-game instance. In at least some aspects, the game-logic circuitry 40 is configured to determine an outcome of the wagering-game instance at least partially in response to the random parameter.

In one embodiment, the gaming machine 10 and, additionally or alternatively, the external system 60 (e.g., a gaming server), means gaming equipment that meets the hardware and software requirements for security and predictability as established by at least one state's gaming control board or commission. Prior to commercial deployment, the gaming machine 10, the external system 60, or both and the casino wagering game played thereon may need to satisfy minimum technical standards and require regulatory approval from a gaming control board or commission (e.g., the Nevada Gaming Commission, Alderney Gambling Control Commission, National Indian Gaming Commission, etc.) charged with regulating casino and other types of gaming in a defined geographical area, such as a state. By way of non-limiting example, a gaming machine in Nevada means a device as set forth in NRS 463.0155, 463.0191, and all other relevant provisions of the Nevada Gaming Control Act, and the gaming machine cannot be deployed for play in Nevada unless it meets the minimum standards set forth in, for example, Technical Standards 1 and 2 and Regulations 5 and 14 issued pursuant to the Nevada Gaming Control Act. Additionally, the gaming machine and the casino wagering game must be approved by the commission pursuant to various provisions in Regulation 14. Comparable statutes, regulations, and technical standards exist in other gaming jurisdictions.

Figure 4A:
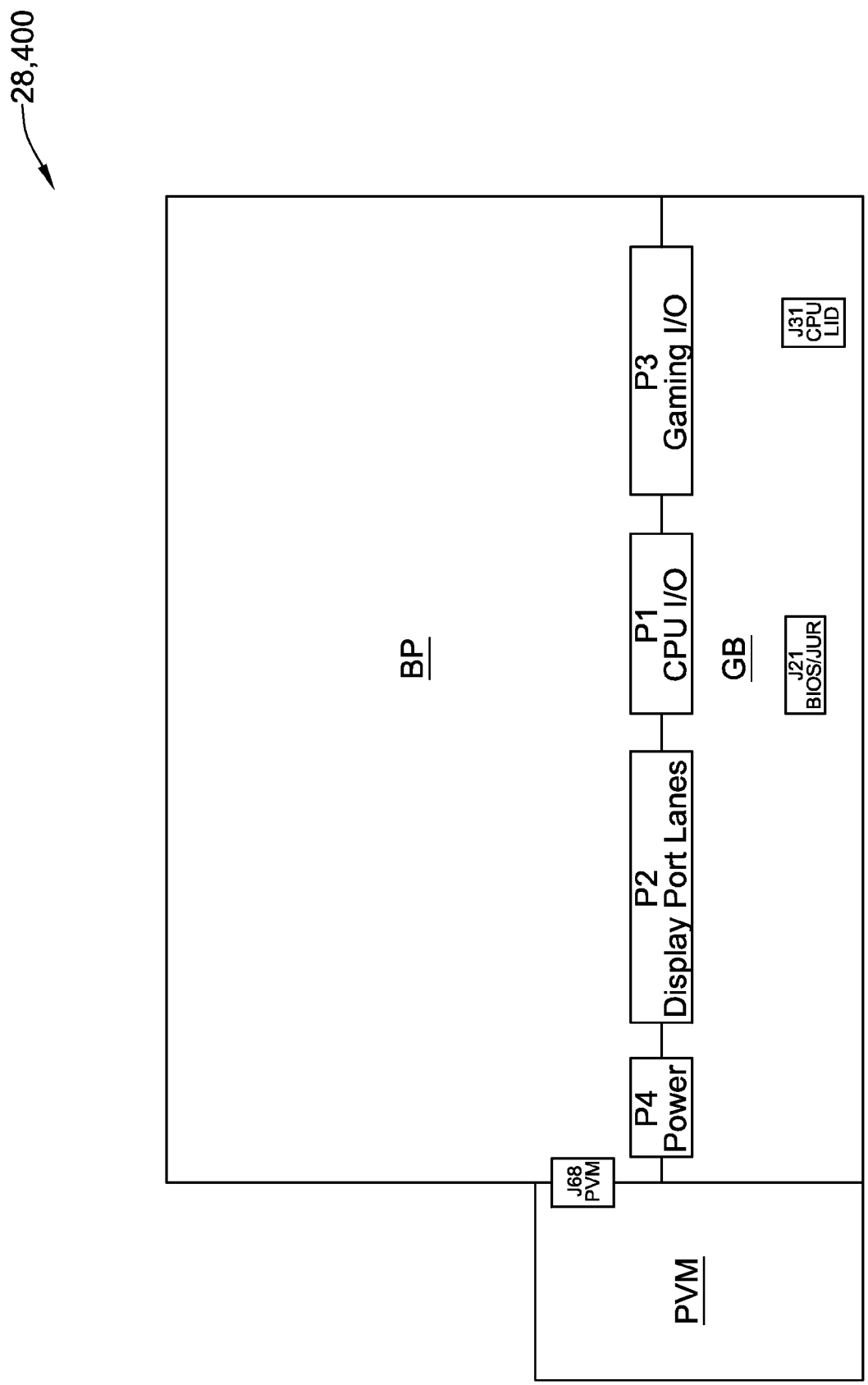
FIG. 4A is a functional block diagram of a portion of the game-logic circuitry of the gaming machine such as the one shown in FIG. 1, where the game-logic circuitry includes two printed circuit boards (PCB) that form a PCB assembly (PCBA).
Figure 4B:
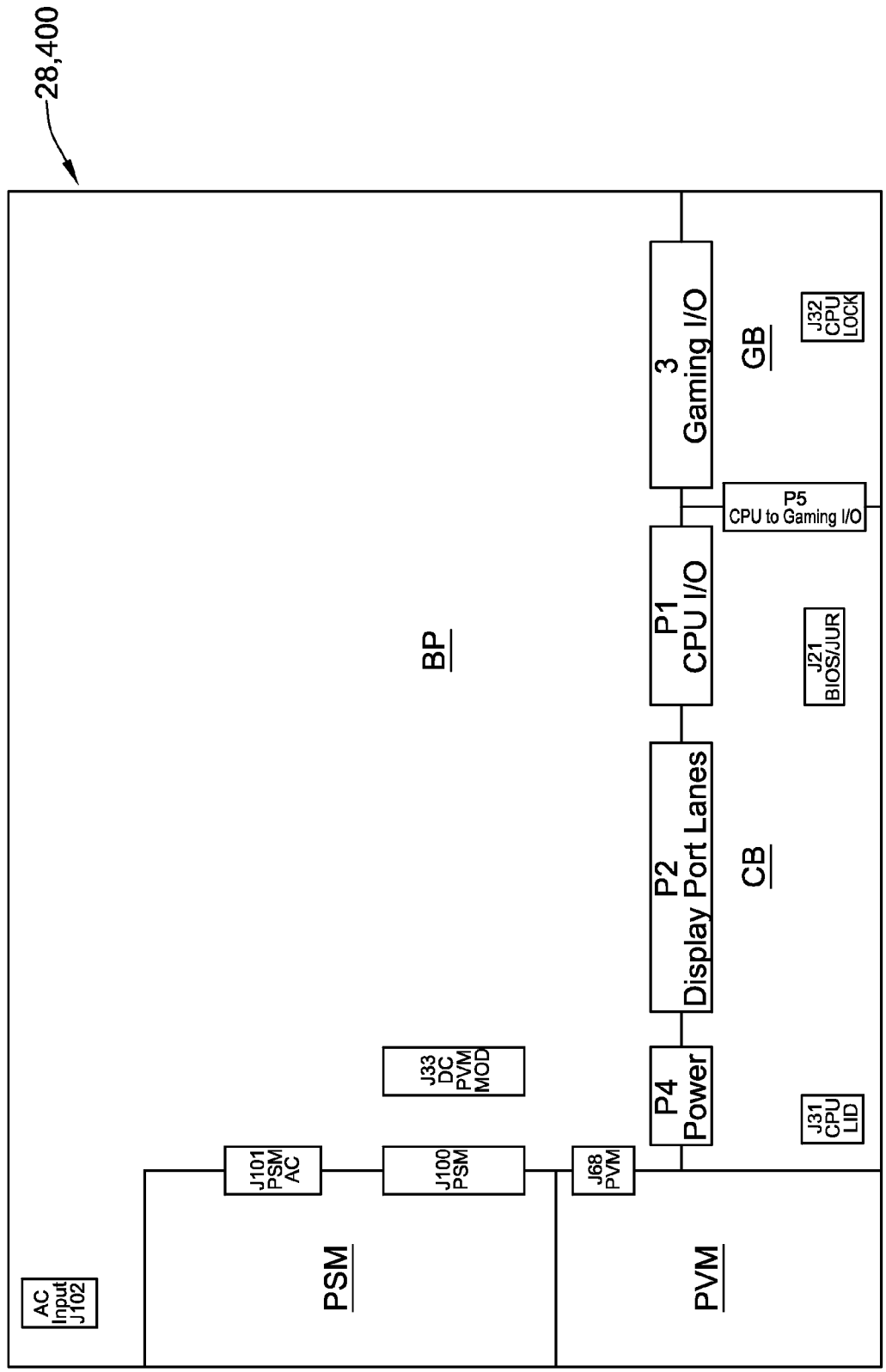
FIG. 4B is a functional block diagram of a portion of the game-logic circuitry of the gaming machine such as the one shown in FIG. 1, where the game-logic circuitry includes three printed circuit boards (PCB) that form a PCB assembly (PCBA).
Figure 4C:
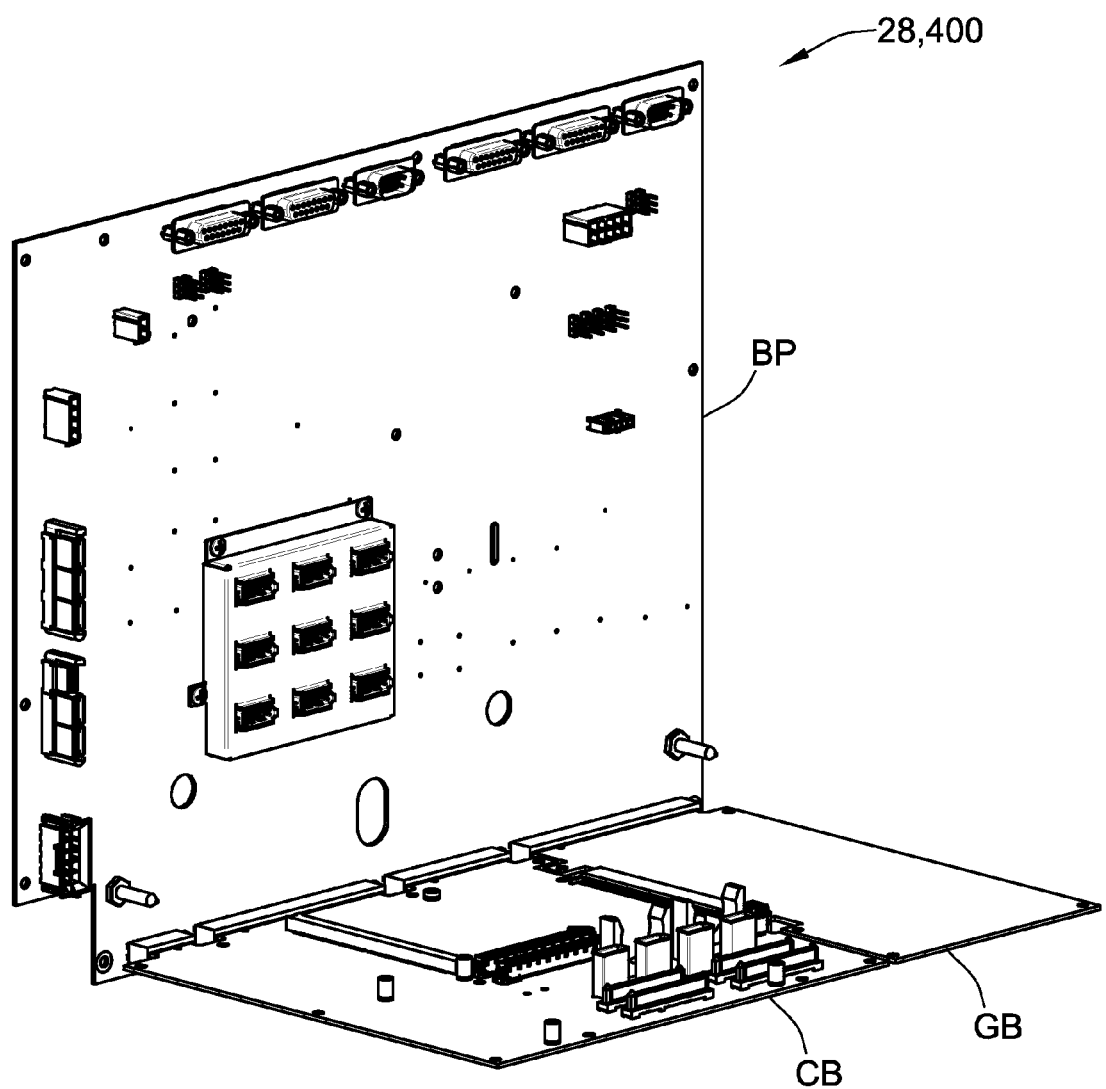
FIG. 4C is a perspective view of a portion of the game-logic circuitry of the gaming machine such as the one shown in FIG. 4B.

Referring now to FIGS. 4A-4C, illustrations of a portion of the game-logic circuitry 28 of the gaming machine 10 are shown as a printed circuit board assembly (PCBA). FIG. 4C illustrates a perspective view of a portion of the game-logic circuitry 28 of the gaming machine 10 is shown as a printed circuit board assembly (PCBA) 400. The PCBA 400 includes three printed circuit boards (PCBs) labeled as BP, GB, and CB. For convenience, BP can refer to a backplane PCB, CB can refer to a CPU PCB, and GB can refer to a Gaming I/O or GIO PCB. These labels are not intended to characterize the only role or functionality of each of these boards but are rather used for ease of discussion purposes. The PCBA is housed inside the cabinet 12 of the gaming machine 10, and are visible and accessible to an operator when a door to the gaming machine 10 is open.

Figure 5:
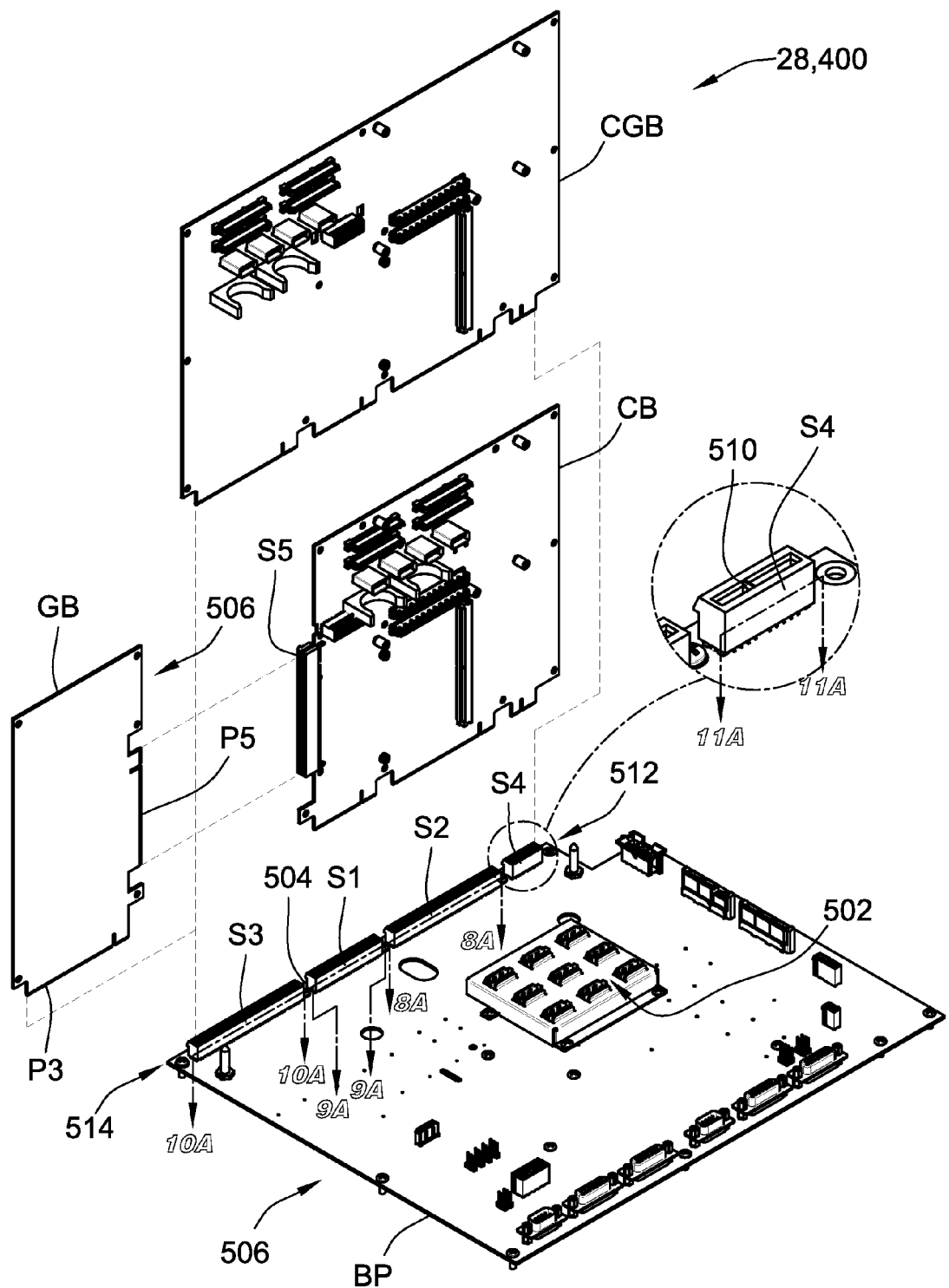
FIG. 5 is an exploded view of the PCBs shown in FIG. 4 along with a combined board labeled CGB as an alternate embodiment that can be plugged into a backplane board BP shown in FIG. 4.

At least one CPU 30 is disposed on the board CB, but is not shown for ease of illustration and because the one or more CPUs 30 can be located anywhere on either major surface of the board CB. In FIG. 5, the boards CB and GB are shown in exploded form away from the backplane BP. Another board, labeled CGB (also shown in FIG. 4A), is also shown for ease of discussion as an alternate embodiment in which some or all of the structures and functionality of the boards CB and GB are combined onto a single substrate or board instead of two separate substrates. In the illustrated examples of FIGS. 4A-4C, physically separating the central-processing aspects from the gaming-specific aspects allows different gaming I/O boards to be plugged into the board CB with different combinations of functionality, capabilities, and the like. Although three boards CB, GB, and CGB are shown in FIG. 5, of course either the boards CB and GB (FIG. 4B) or the board CGB (FIG. 4A) is plugged into the backplane BP at a time.

FIG. 4A illustrates a fan module PVM connected to the backplane BP by a connector J68. The fan module PVM includes one or more fans to cool the electronics of the game-logic circuitry 28 and/or inside the cabinet 12 of the gaming machine 10. As will be discussed below, the PCBAs of the present disclosure supports a modular and scalable assembly that is particularly advantageous in a gaming machine. The PCBA 28, 400 in FIG. 4A shows a combined CGB board having both CPU and gaming I/O components and functionality described herein.

Figure 45:
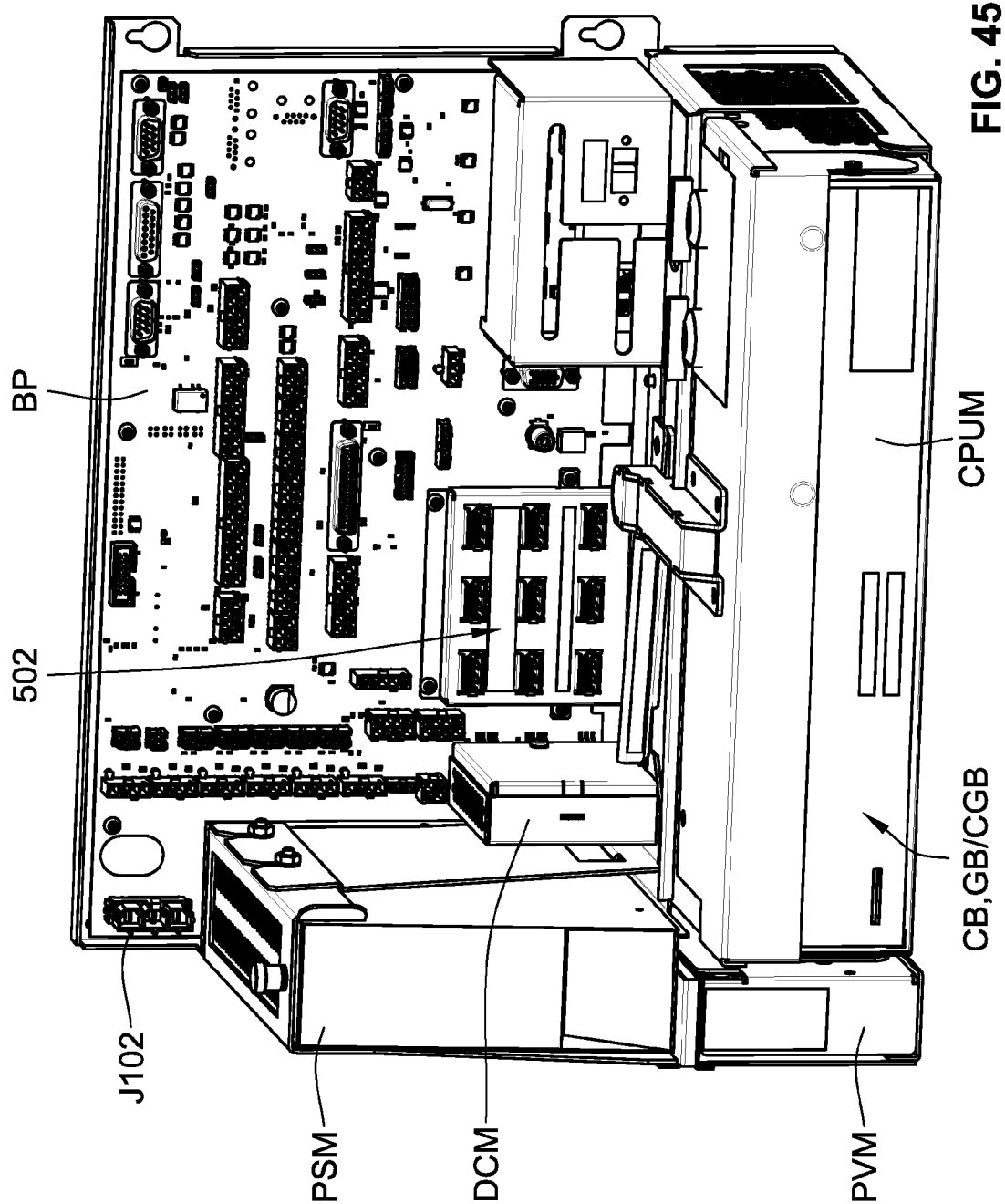
FIG. 45 is a perspective view of a printed circuit board assembly (PCBA) including a power supply module PSM, a DC power supply module DCM, a fan module PVM, and a CPU module CPUM connected to a backplane BP.
Figure 46:
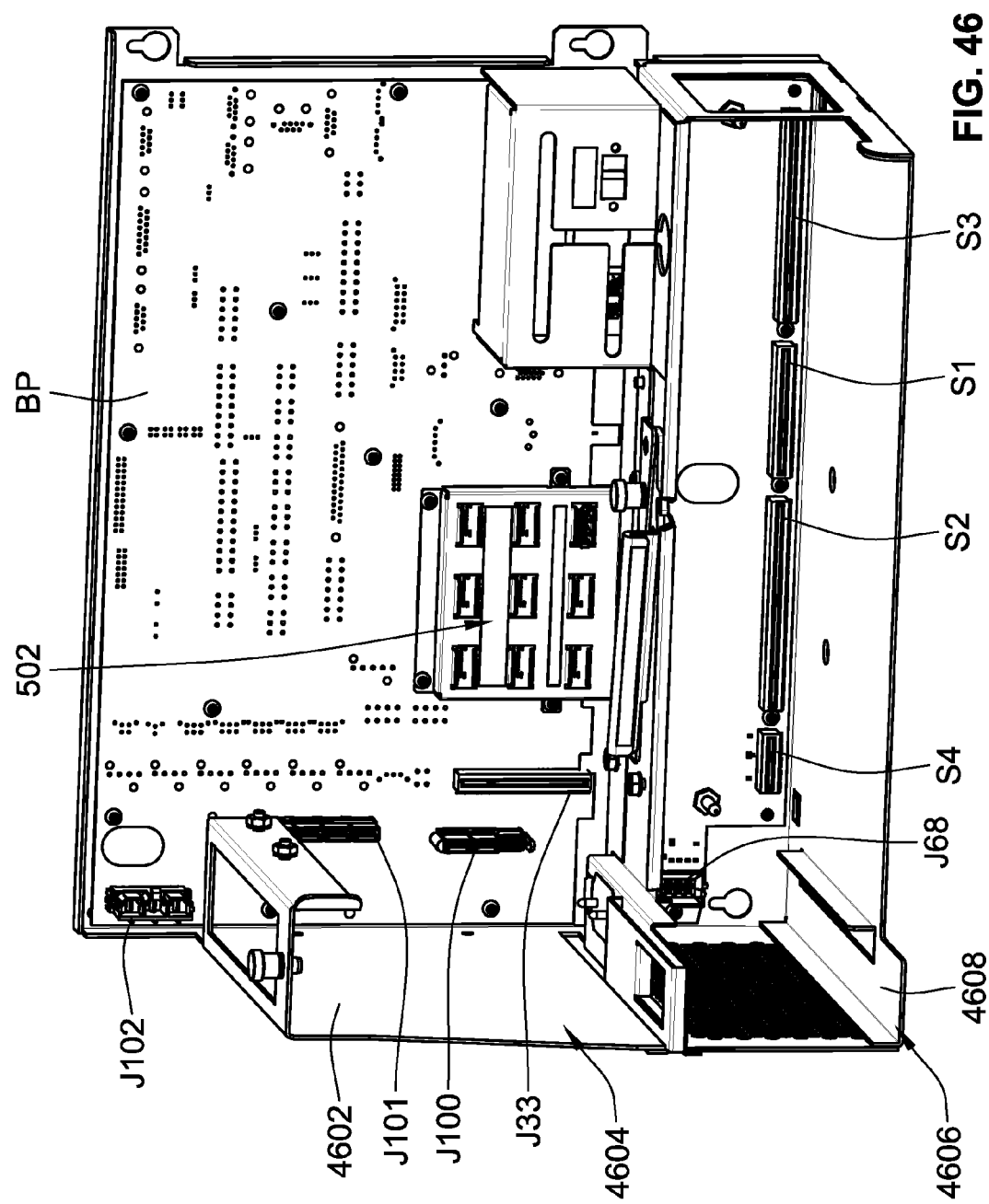
FIG. 46 illustrates the PCBA of FIG. 45 but with the modules PSM, DCM, PVM, and CPUM disconnected and removed from the backplane BP.

By contrast, in FIG. 4B, the PCBA 28, 400 has separate CB and GB boards, and further adds a power supply module PSM in addition to the fan module PVM. An AC input connector of a receptacle header type labeled J102 is also disposed on the backplane BP as shown (not shown in FIG. 4A but can be present on the backplane BP). The backplane BP also includes a DC power module connector labeled J33 for connecting a DC power module DCM (FIGS. 45, 48) to the backplane BP. An example of the PCBA 28, 400 shown in FIG. 4B can be seen in FIG. 45, in which the backplane BP is assembled with a power supply module PSM, a DC power module DSM, a fan module PVM, and a CPU module CPUM having therewithin the boards CB and GB or CGB. FIG. 46 illustrates the same PCBA 28, 400, but with the modules PSM, DSM, PVM, and CPUM removed to expose the parts of the backplane BP that are hidden from view in FIG. 45. Here, the socket connectors S1-S4 described below can be seen on the backplane BP. Attached to the backplane BP is a metal housing having an upper compartment 4604 and a lower compartment 4606 dimensioned to receive the power supply module PSM and fan module PVM, respectively. A guide 4608 allows the fan module PVM to be slid blindly into place into the connector J68 on the backplane BP. Likewise, sliding the power supply module PSM into the upper compartment 4606 against a wall 4602 allows the power supply module PSM to be slid blindly into place into the connectors J101 and J100 on the backplane BP.

CPU Board CB/CGB

Details of the CPU board CB will now be discussed. These aspects apply equally to the board CGB shown in FIG. 5, which combines the structures and functionality of the boards CB and GB into a single printed circuit board instead of two PCBs. The reference numbers start with the figure number where they are first introduced. For example, reference number 602 can be found in FIG. 6, and reference number 1100A can be found in FIG. 11.

Figure 6:
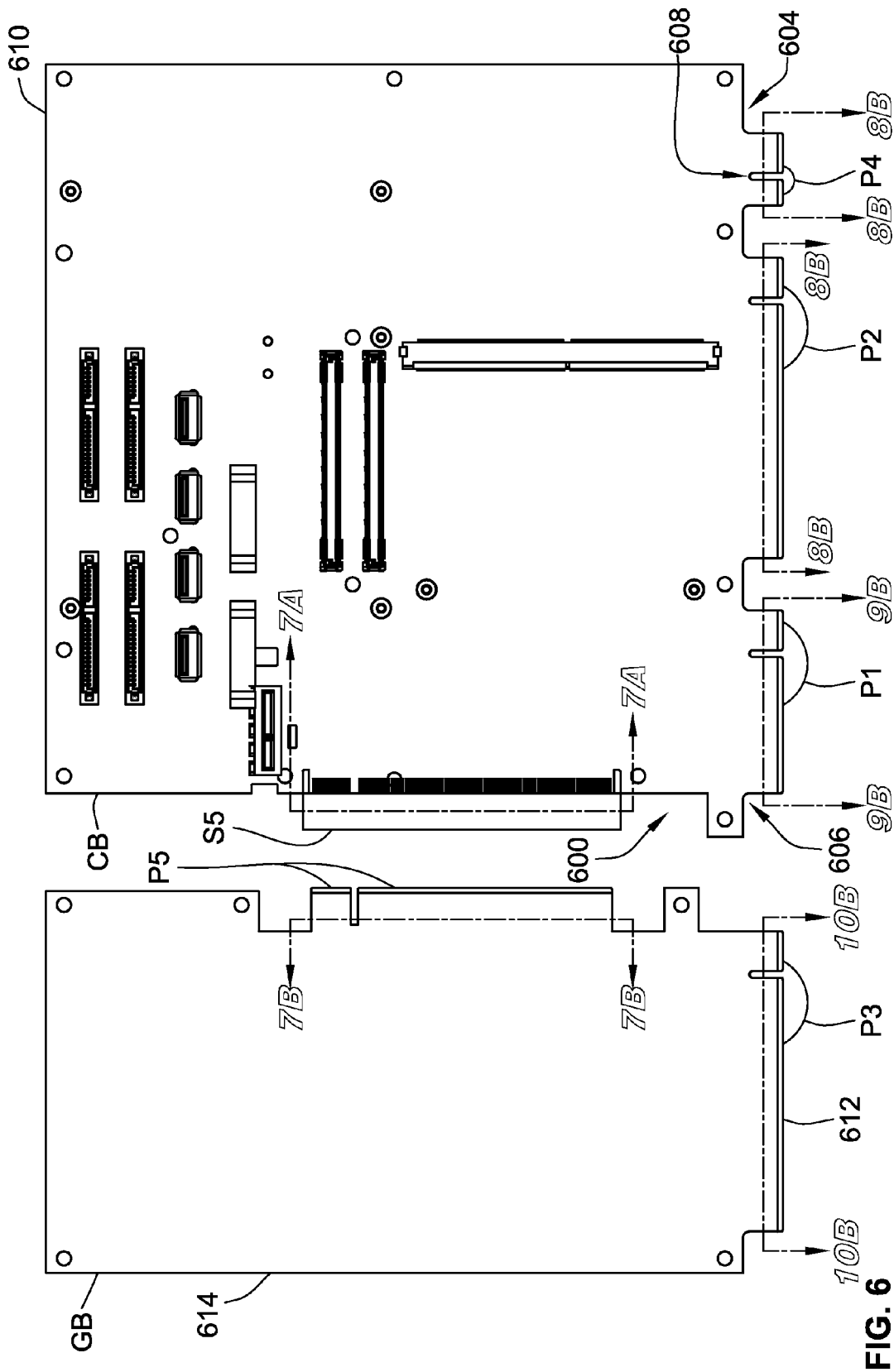
FIG. 6 is a top plan view of two of the PCBs labeled as GB and CB in FIG. 4, according to an aspect of the present disclosure.
Figure 12:
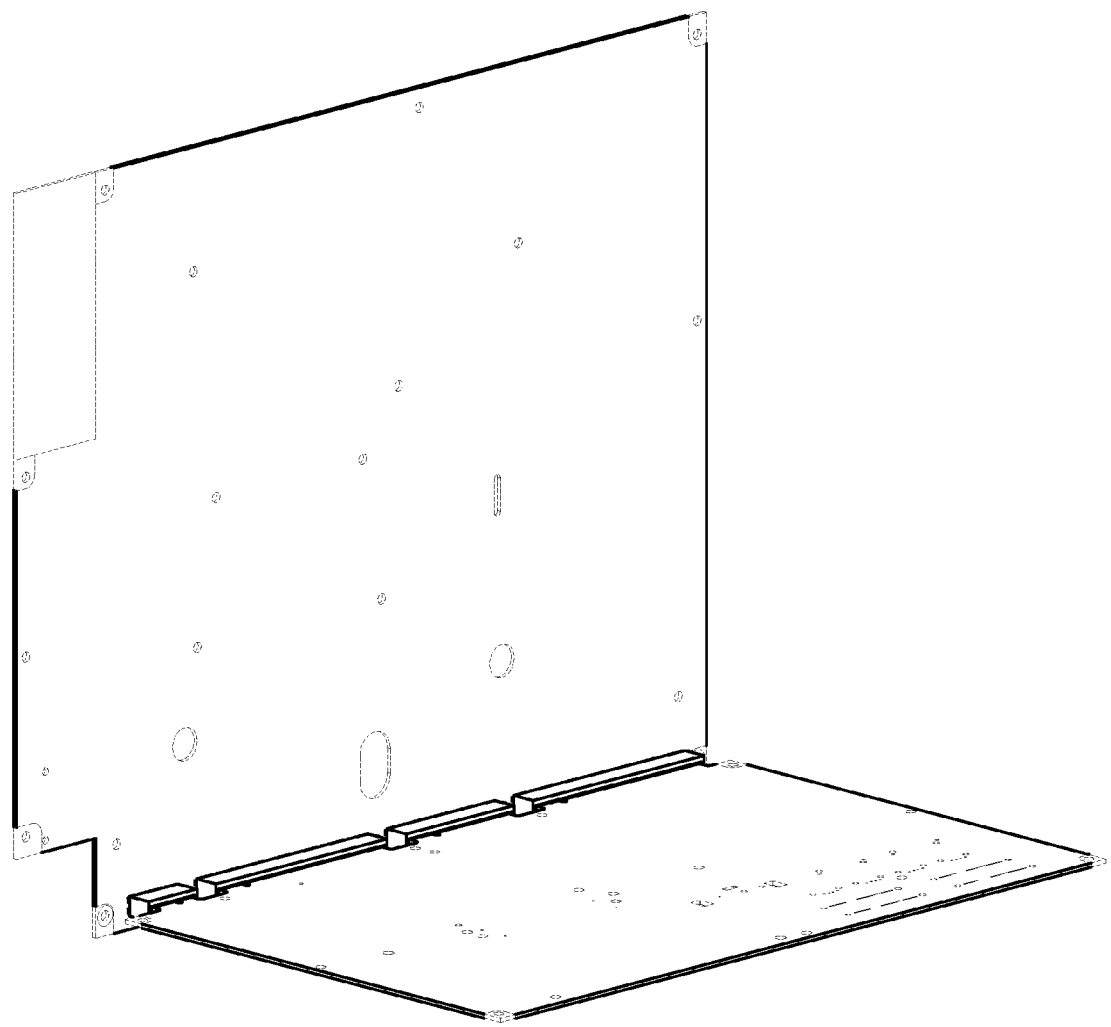
FIG. 12 is an isometric view of a printed circuit board assembly (PCBA) having a backplane printed circuit board (PCB) bearing four connector sockets and another PCB having four edge connectors mated with the corresponding connector sockets on the backplane PCB, according to an embodiment of the present disclosure.
Figure 13:
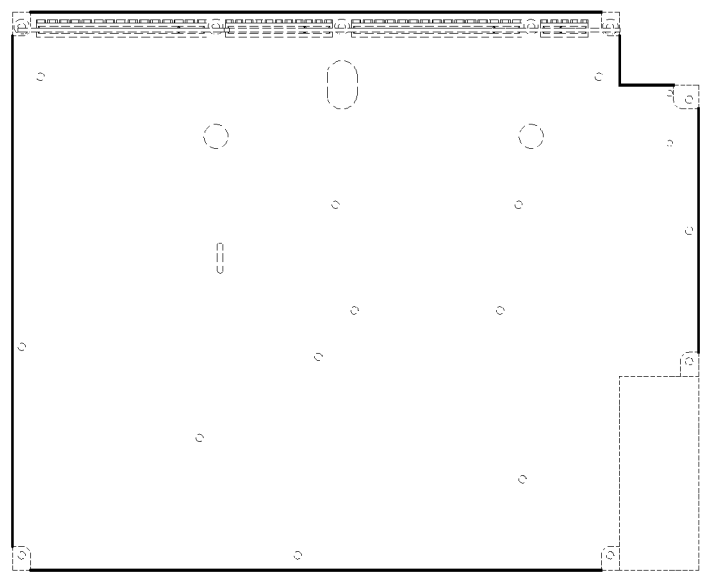
FIG. 13 is a top view of the backplane PCB only shown in FIG. 12.
Figure 14:
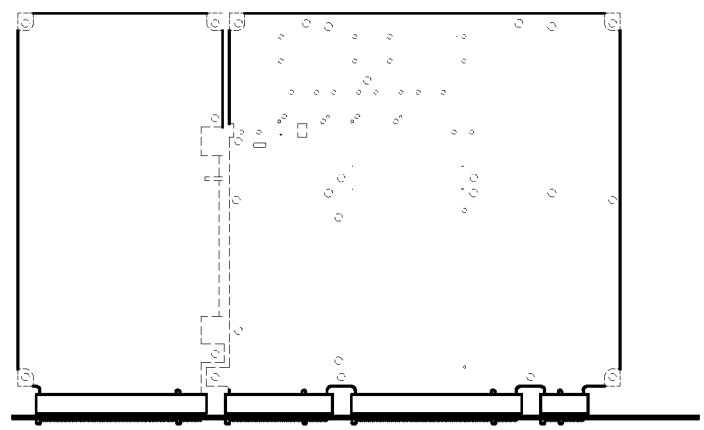
FIG. 14 is a front view of the PCBA shown in FIG. 19.
Figure 15:
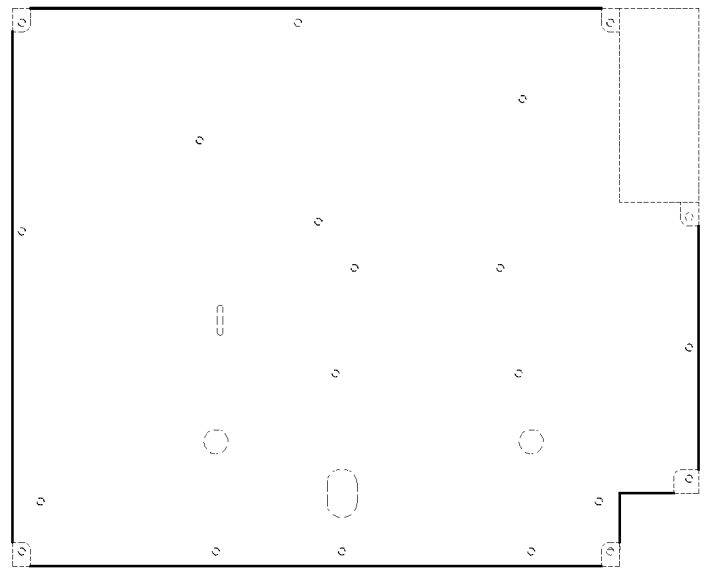
FIG. 15 is a bottom view of the backplane PCB shown in FIGS. 12 and 19.
Figure 16:
FIG. 16 is a view of an end of the PCBA shown in FIGS. 12 and 19.
Figure 17:
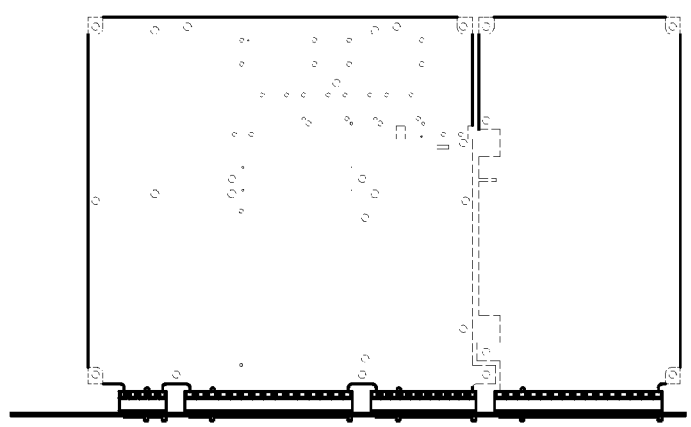
FIG. 17 is a rear view of the PCBA shown in FIG. 19.
Figure 18:
FIG. 18 is a view of the other end of the PCBA shown in FIGS. 12 and 19.
Figure 19:
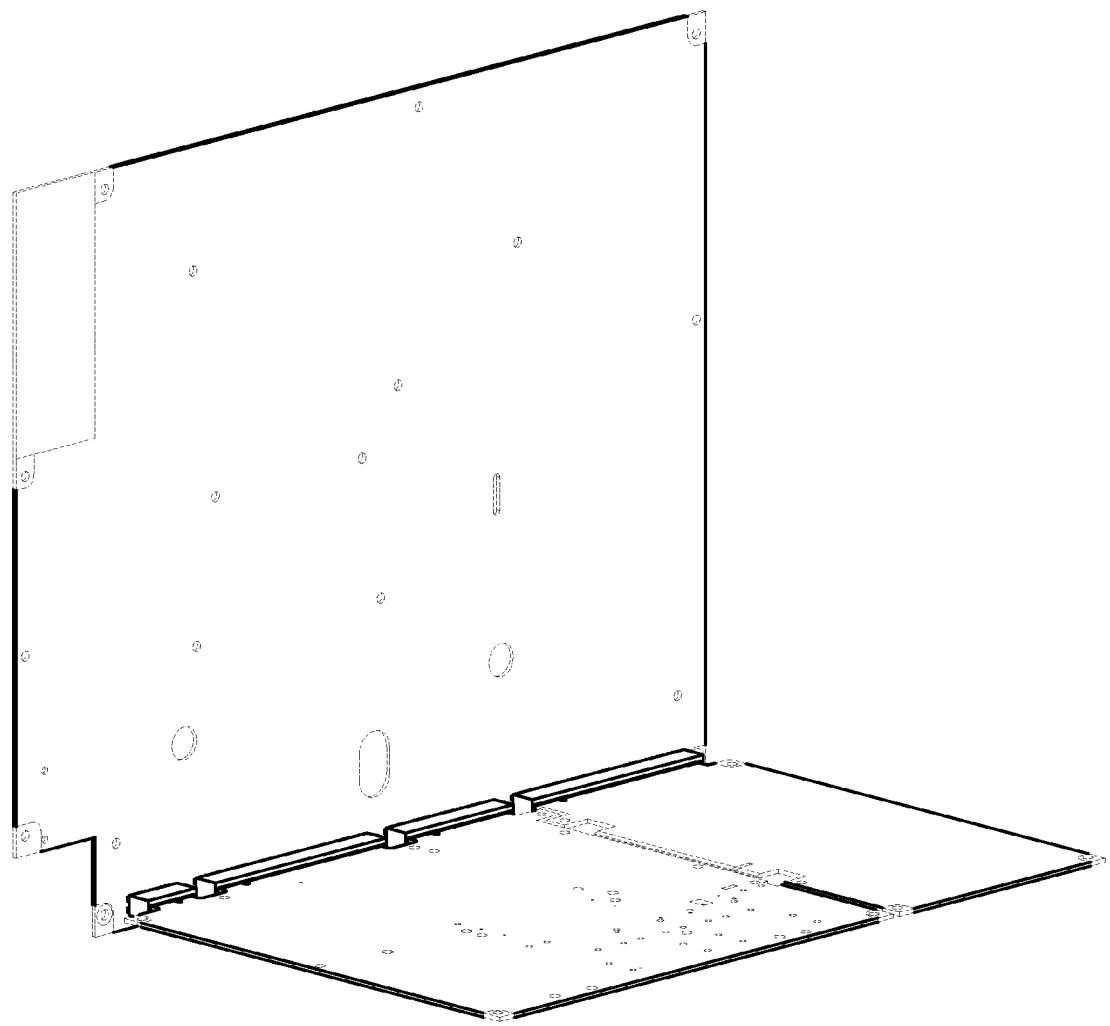
FIG. 19 is an isometric view of a PCBA according to another embodiment of the present disclosure where the PCB includes a backplane printed circuit board (PCB) bearing four connector sockets and a first PCB having three edge connectors mated with three corresponding connector sockets on the backplane PCB and a second PCB having an edge connector mated with the fourth corresponding connector socket on the backplane PCB.
Figure 20:
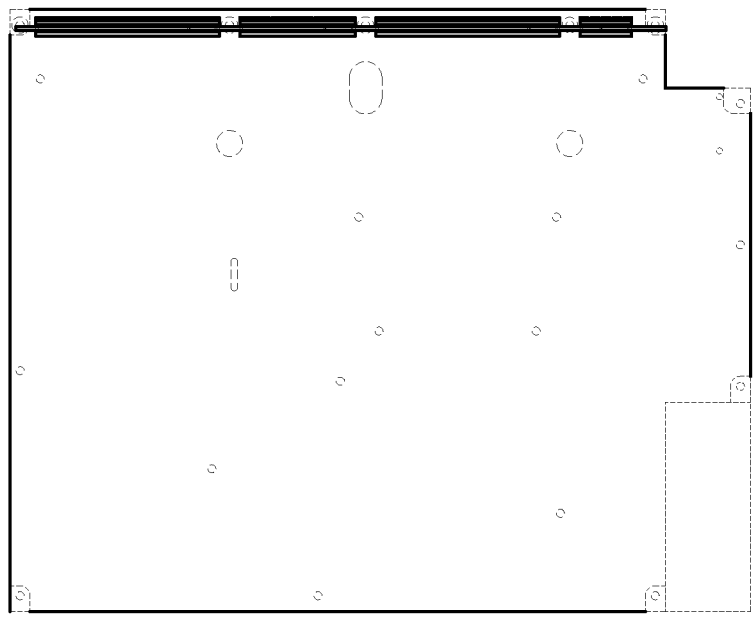
FIG. 20 is a top view of the PCBA shown in FIG. 12.
Figure 21:
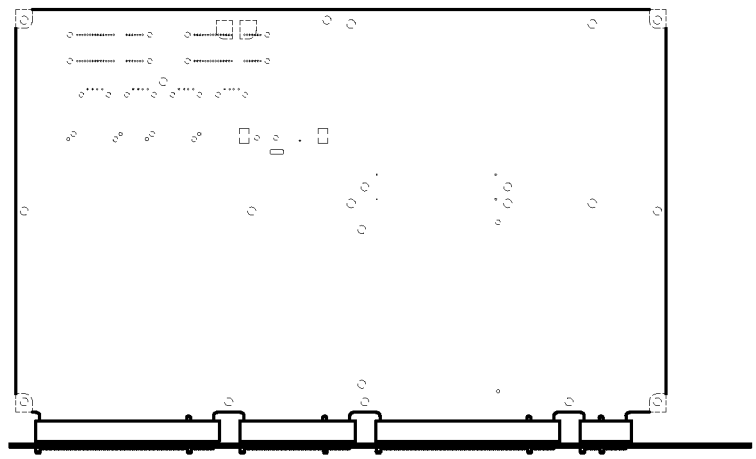
FIG. 21 is a front view of the PCBA shown in FIG. 12.
Figure 22:
FIG. 22 is a side view of the PCBA shown in FIGS. 12 and 19; the other side view being identical.
Figure 23:
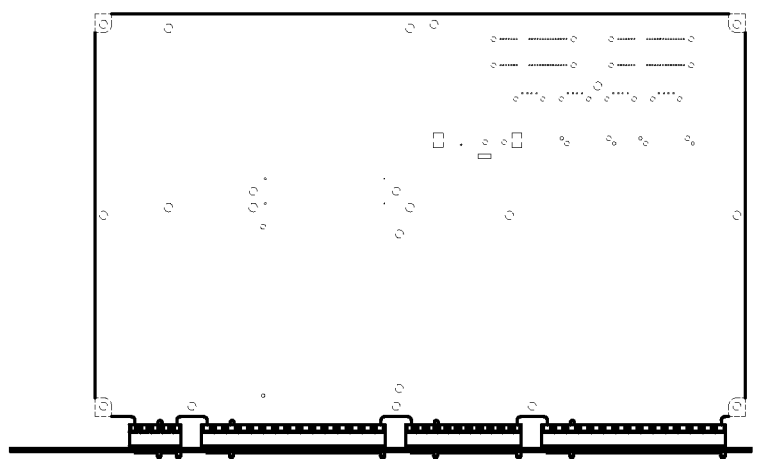
FIG. 23 is a rear view of the PCBA shown in FIG. 12.
Figure 24:
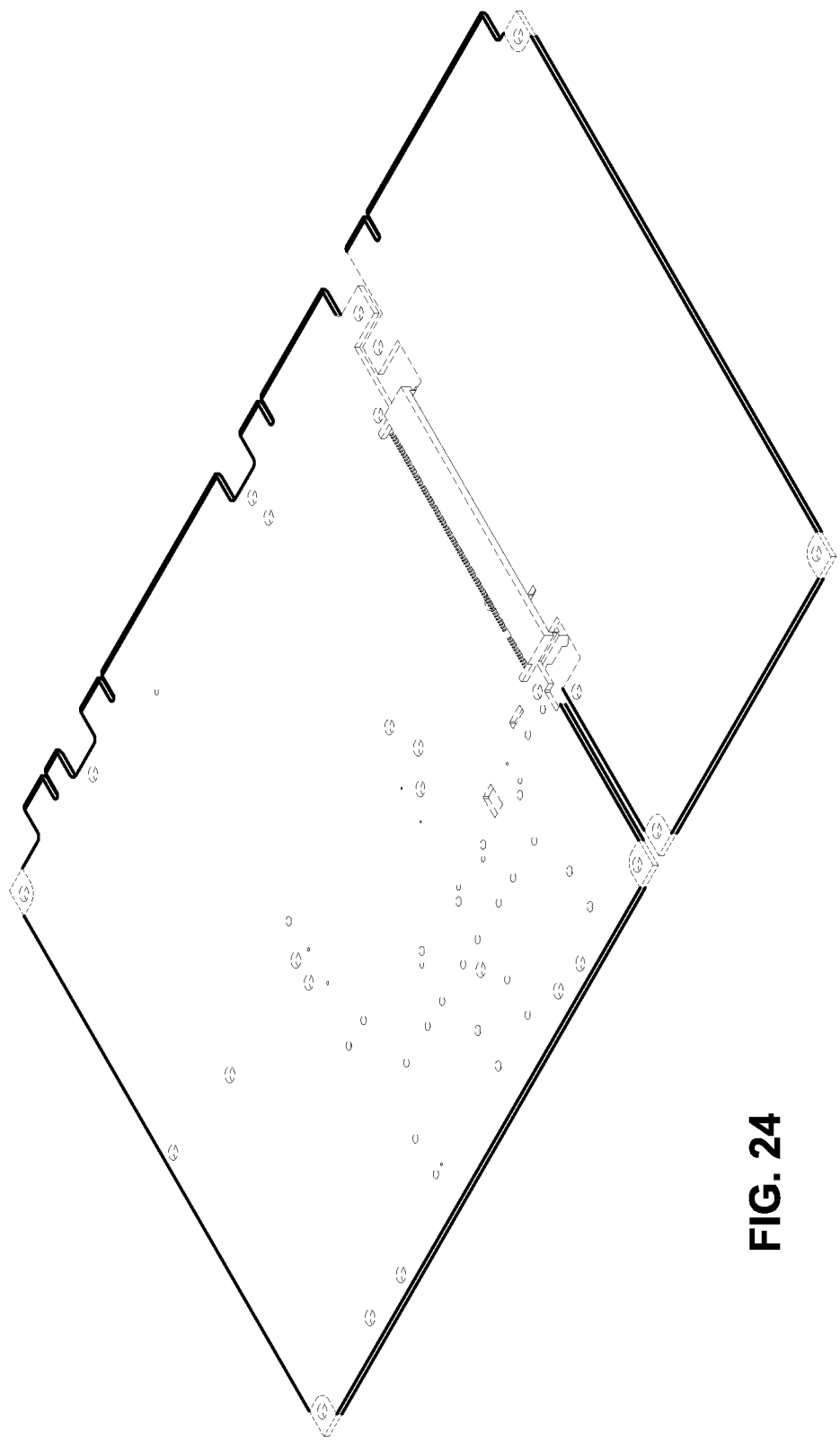
FIG. 24 is an isometric view of the first PCB and the second PCB shown in FIG. 19.
Figure 25:
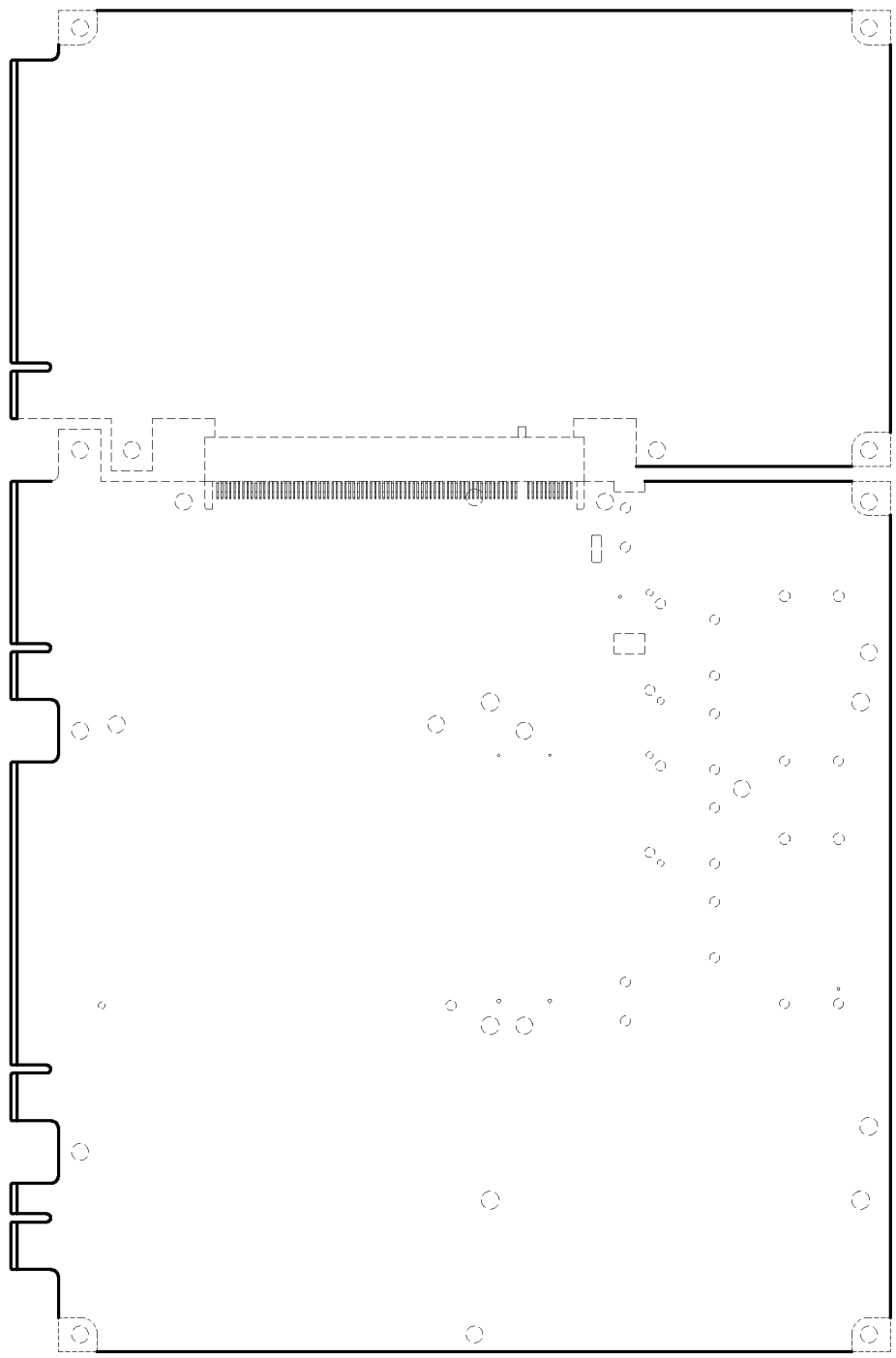
FIG. 25 is a top view of the first and second PCBs shown in FIG. 24.
Figure 26:
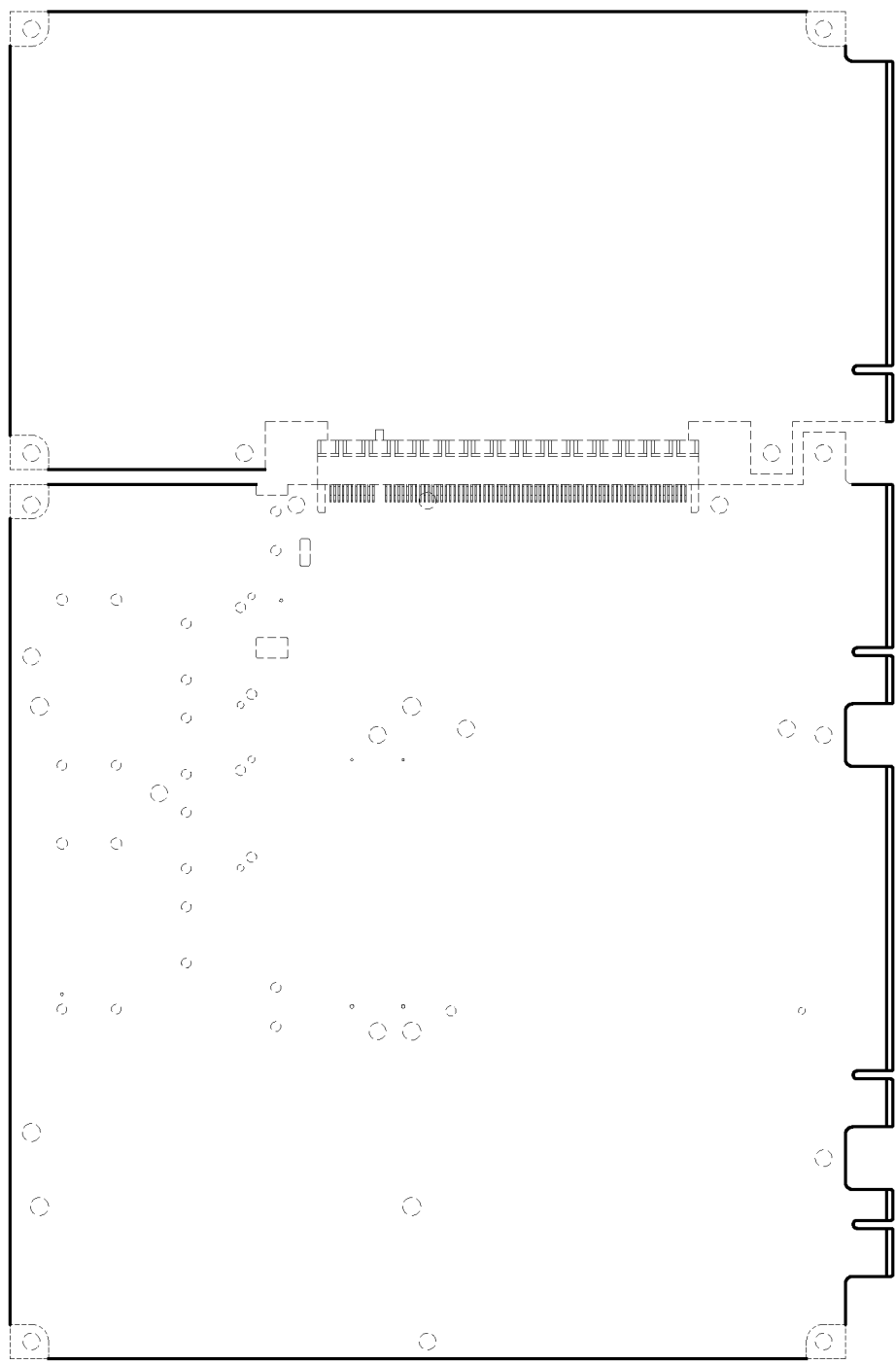
FIG. 26 is a bottom view of the first and second PCBs shown in FIG. 24.
Figure 27:
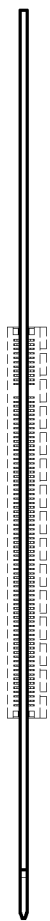
FIG. 27 is an end view along the shortest side edge of the second PCB shown in FIG. 26.
Figure 28:
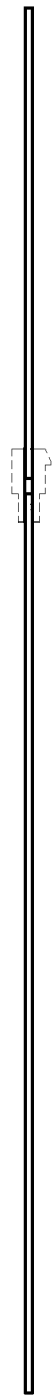
FIG. 28 is a side view from the top longest edge of the first and second PCBs shown in FIG. 24.
Figure 29:
FIG. 29 is a view of the other end of the second PCB shown in FIG. 27.
Figure 30:
FIG. 30 is a view of the other side of the first and second PCBs shown in FIG. 28.
Figure 31:
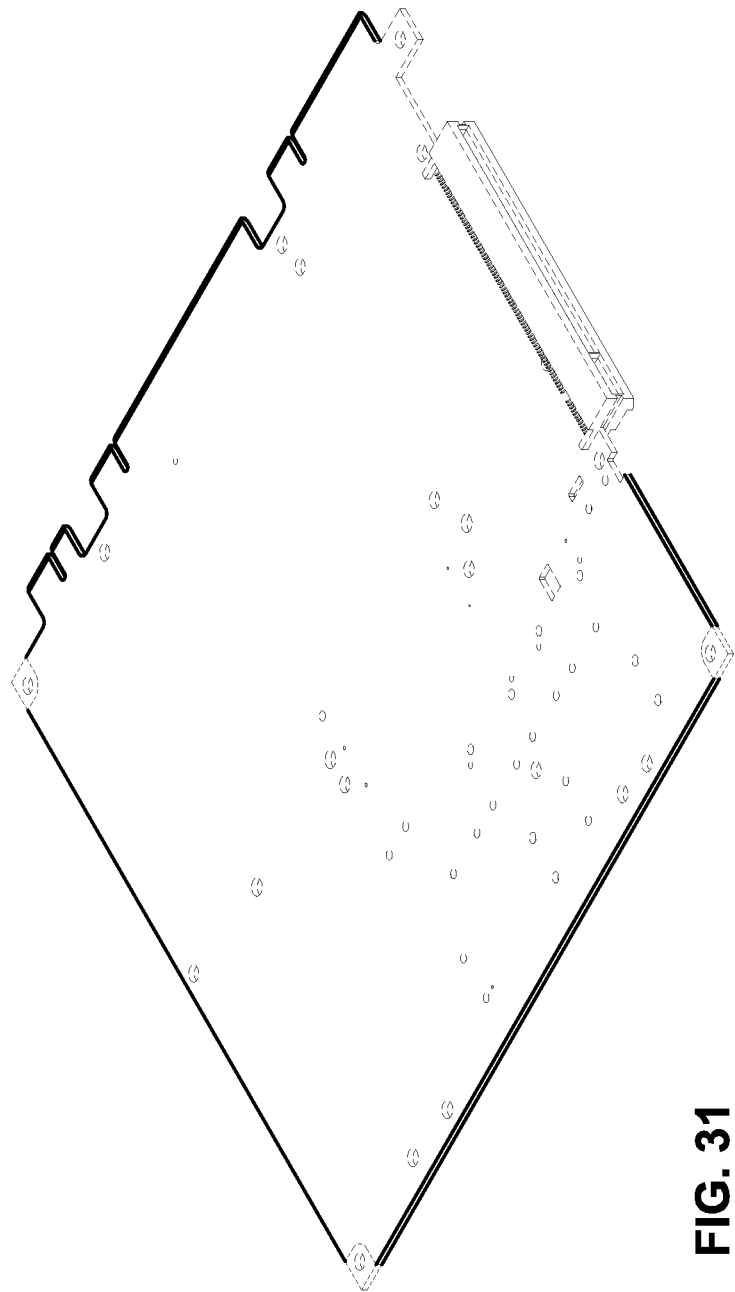
FIG. 31 is an isometric view of a first printed circuit board (PCB).
Figure 38:
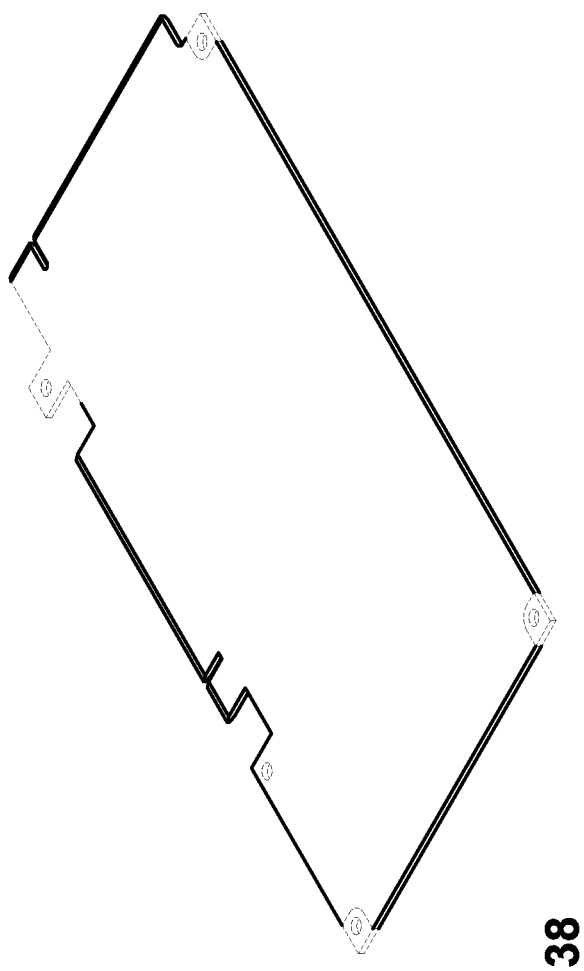
FIG. 38 is an isometric view of a second printed circuit board (PCB).

The board CB is a printed circuit board (PCB) having a long edge 602 next to a short edge 600 (FIG. 6). The board CB has a generally rectangular shape, but it can be square or take on any other form factor. As shown generally in FIG. 4, the board CB includes a CPU 30 (FIG. 2). There is a power edge connector P4 on the long edge 602 at a corner section 604 of the board CB (FIG. 6). As shown in FIG. 6, the power edge connector P4 is not immediately adjacent to the corner between the short and long edges 600, 602, but is in a corner section that includes the corner. The term "edge connector" has its plain and ordinary meaning as understood by those skilled in the art of printed circuit board design. For example, the edge connector is actually part of the substrate that forms the board CB, and there are exposed electrical traces on one or both sides of the board that lead to the outermost edge of the board. An edge connector is conventionally plugged into a corresponding female socket connector or socket, with the traces electrically and physically mating with corresponding pins inside the socket connector. For example, the socket connectors described herein can physically correspond to Peripheral Component Interconnect Express (PCIe) sockets. As those skilled in the art of printed circuit boards will understand, PCIe refers to a high-speed serial computer expansion bus standard. However, as described herein, the pinout functionality assigned to each of the connections is not necessarily the same as defined in the PCIe bus standard and in fact can bear no relation whatsoever to the PCIe bus standard. In other words, the edge connectors and sockets are structurally the same as a conventional PCIe edge connector and socket, but the pinout definitions for each of the connections for a given connector-socket pair do not necessarily correspond to the PCIe standard (though at least some connections can correspond to the PCIe bus standard as described below).

Returning to the board CB shown in FIG. 6, the power edge connector P4 has a key notch 608, which is conventionally found in PCIe edge connectors and aids in preventing wrong-way insertion of the edge connector into a corresponding socket. The key notch 608 ensures that that there is only one way that the edge connector can be mated into a corresponding socket connector. The power edge connector P4 also includes consecutively arranged power connections (e.g., electrically conductive traces) along an upper side 1100A (shown FIG. 11) and a lower side 1100B (also shown in FIG. 11) opposite the upper side 1100A of the power edge connector P4 on one side 1102 of the key notch 608. For example, each of the power connections can carry a positive voltage from a power source, such as 24V. The upper side 1100A is typically the same side that electrical components are disposed on a surface of the board CB, and the lower side 1100B is typically the reverse side of the board CB. In addition, the power edge connector P4 has consecutively arranged ground connections (e.g., electrically grounded traces) along the lower and upper sides 1100A, 1100B of the power edge connector P4 on the other side 1104 of the key notch 608. In a non-limiting example, the first seven upper and lower connections of the power edge connector P4 are assigned to carry 24V power, and the last six upper and lower connections of the power edge connector P4 are assigned to carry ground. The terms "first" and "last" in this context refer to the pin assignments as specified for a PCIe connector. Typically, the upper pins or connections are numbered A1, A2, and so forth, whereas the lower pins or connections are numbered B1, B2, and so forth. In this example, the power edge connector P4 can be a one-lane PCIe x1 edge connector, which has 18 upper connections, and 18 lower connections. There are at least four connections or pins separating the power and ground connections on both sides of the power edge connector P4, which provides a physical isolation between power and ground to minimize the risk of shorting due to inadvertent introduction of a conductor, such as a screwdriver head, for example, on either side of the board CB. In addition, the power and ground connections and pins are further separated from each other by a key (on the socket S4) and corresponding key notch (on the edge connector P4). In other words, on either side 1100A, 1100B of the power edge connector P4, there are no power or ground connections present on both sides of the key notch. This separation of power and ground connections so that all power connections are on one side 1102 of the key notch 608 and all ground connections are on the other side 1104 of the key notch 608 minimizes the risk of inadvertent power-to-ground shorting.

FIG. 11A shows a functional diagram of exemplary locations of the connections or pins on the power edge connector P4 or its corresponding power connector socket S4. The topmost connections or pins appear on an upper row or "A" side of the edge/socket connector P4/S4, and the bottom connections or pins appear on a lower row or "B" side of the same edge/socket connector P4/S4. The first connection or pin A1 on the upper row starts on the upper left corner of the edge/socket connector P4/S4. The first connection or pin B1 on the lower row starts in the lower left corner of the connector P4/S4. The last connection or pin A18 on the upper row appears on the upper right corner of the connector P4/S4, and the last connection or pin B18 on the lower row appears on the lower right corner of the connector P4/S4. Connections or pins shown in solid black correspond to a ground connection. In this example, there is another connection or pin 1132 labeled P4 Pin Sense, and this connection or pin is used to ensure that the board CB or the board CGB has been properly seated before the respective boards are put into an operational state. The different logical requirements will be described in more detail below. In this example, only one pin or connection must be in an active state (either active high or active low) to be considered in logical active state for purposes of the logic described below. In other examples, more than one pin or connection (such as two) can be required to deem the board to be properly seated, particularly as the length of the connector grows. In the case of the power edge connector P4, this connector in this example is relatively small (e.g., a one-lane PCIe x1 connector), so only one pin or connection is utilized in this example, to maximize the number of connections used for power and ground.

FIG. 11B shows a top view (A side) of the power edge connector P4. The connections (seven in this example) carrying the +24V power signals are merged into a single conductor blade 1120 to allow a maximum amount of volume for carrying current through these connections. Likewise, the last connections (six in this example on the A side) carrying the ground signals are merged into a single conductor blade 1130 to allow a maximum amount of volume for the return to ground through these connections. The other connections are made by individual conductive "fingers," such as the fan connections 1122, 1124, 1126, and the power connection 1128 for the electronic gaming machine (EGM) 10. The power and ground connections on the bottom or B side of the connector P4 (not shown) can likewise be merged into corresponding conductor blades instead of individual fingers. Note that FIG. 11A is not intended to be a cross-section illustration of the power edge connector P4, but rather a functional representation of the connections on either side of the key 608 and on both sides A and B of the connector P4.

The board CB shown in FIG. 6 also has a display edge connector P2 on the long edge 602 next to the power edge connector P4. In this illustrated example, by "next to," it is meant that there are no intervening edge connectors between the two adjacent edge connectors P2, P4. The display edge connector P2 has many differential pairs of differential connections physically arranged on the display edge connector P2 such that at least one ground connection exists (e.g., two or three consecutive ground connections can also exist) between adjacent differential pairs of differential connections. Each differential pair is configured to carry a video signal to one of the video ports 502 external to the board CB. For example, the video ports 502 can be located on the backplane BP.

In the illustrated example, the display edge connector P2 is a 16-lane PCIe x16 connector having 164 connections/pins. Intermixing the ground connections between adjacent differential pairs of differential connections provides a close return for current passing through the differential connections as well as electrical isolation between adjacent differential pairs of differential connections. The differential connections can support high-speed, high-frequency signals oscillating as high as on the order of multiple Gigahertz, such as 5 GHz. As can be seen in FIG. 4, these differential connections are connected to corresponding electrical traces (not shown) that lead directly and as straight as possible to the video ports 502 on the backplane BP, and the video ports 502 are physically located as close as possible to the display edge connector P2 so that the traces carrying high-speed, high-frequency differential video output signals between the display edge connector P2 and the corresponding video ports 502 can be as short as possible. In addition, a ground plane can be disposed on a layer immediately below the electrical traces to create a return path to ground that is as short as possible. In a non-limiting example, the display edge connector P2 has sufficient differential connections to support nine video display ports distributed across its 164 pin connections. Thus, for example, the video ports 502 on the backplane BP can be composed of nine video display ports. Of course, in other aspects, a different number of differential pairs of differential connections can support different numbers of video ports, such as up to three, or up to four, or up to five, or up to six, or up to seven, or up to eight video ports.

FIG. 8 shows a functional diagram of exemplary locations of the connections or pins on the display edge connector P2 or its corresponding display connector socket S2. The topmost connections or pins appear on an upper row or "A" side of the edge/socket connector P2/S2, and the bottom connections or pins appear on a lower row or "B" side of the same edge/socket connector P2/S2. The first connection or pin A1 on the upper row starts on the upper left corner of the edge/socket connector P2/S2. The first connection or pin B1 on the lower row starts in the lower left corner of the connector P2/S2. The last connection or pin A82 on the upper row appears on the upper right corner of the connector P2/S2, and the last connection or pin B82 on the lower row appears on the lower right corner of the connector P2/S2. Connections or pins shown in solid black correspond to a ground connection. Due to the length of the connector P2/S2 and size constraints, some of the 164 connections or pins are not shown in the illustrated example.

The board CB also has an I/O (input/output) edge connector P1 on the long edge 602 next to the display edge connector P2 at an opposite corner section 606 (FIG. 6) of the board CB. The I/O edge connector P1 has connections that are connected to respective electrical traces leading to respective pins (not shown) of the CPU 30. In this illustrated example, by "next to," it is meant that there are no intervening edge connectors between the two adjacent edge connectors P1, P2. The I/O edge connector P1 can be an 8-lane PCIe x8 connector having 98 pin connections. In the illustrated example, Ethernet-related connections are grouped together in consecutive latter pins of the I/O edge connector P1, because Ethernet signals can be carried outside the gaming machine 10 on long cables, the Ethernet signals are grouped together on consecutive pins on both upper and lower sides of the I/O edge connector P1. In addition, in this example, the I/O edge connector P1 includes multiple high-speed USB (universal serial bus) connections, which are also grouped together on consecutive pins on the upper "A" side of the I/O edge connector P1 so that all of the traces carrying high-speed USB signals stay on one PCB layer. Between each transmit or receive pair of USB connections on the connector P1, a ground connection exists for isolation between adjacent transmit/receive pairs and a quick return to ground. As can be seen in FIG. 5, the position of the socket S1, which receives the I/O edge connector P1, allows the USB traces on the top layer of the backplane BP to run directly and straight to their corresponding destination high-speed USB (e.g., USB 3.0/3.1) port(s) (not shown for ease of illustration) on the backplane BP. On the lower "B" side of the I/O edge connector P1, low-speed signals can be carried, as these can run along longer traces, and even jump PCB layers if needed to avoid other more critical traces that cannot jump layers. The terms low-speed and high-speed with respect to signals have their meanings as understood by those skilled in the computer arts. Generally speaking, low-speed signals can run on longer traces and are less susceptible to electromagnetic interference and other undesired effects. High-speed signals usually run on shorter traces and are more susceptible to electromagnetic interference. The I/O edge connector P1 can also include analog audio connections, which can be isolated with an analog ground that exists directly under the analog traces that carry analog audio signals between the board CB and the backplane BP. In an example, the analog ground connections are grouped in the first several pins of the upper and lower sides of the I/O edge connector P1. This also isolates the analog ground connections from the digital ground connections that can be interspersed throughout the remainder of the I/O edge connector P1, such as in the case of the USB connections.

In addition, as with the power edge connector P4, the display edge connector P2 also includes connections that must be made to ensure that the board CB has been properly seated into the socket S2 on the backplane BP. In this example, the first connection B1 on the B side (labeled P2 Seated) is used to ensure that the P2 connector has been properly seated within the socket S2. This connection must be in an active state to inform the logic circuitry (described below) that the board CB or CGB can be brought into an operational state. Again, more than one connection on the display edge connector P2 can be used to ensure proper seating between the connector P2 and corresponding socket S2.

FIG. 9 shows a functional diagram of exemplary locations of the connections or pins on the I/O edge connector P1 or its corresponding I/O connector socket S1. The topmost connections or pins appear on an upper row or "A" side of the edge/socket connector P1/S1, and the bottom connections or pins appear on a lower row or "B" side of the same edge/socket connector P1/S1. The first connection or pin A1 on the upper row starts on the upper left corner of the edge/socket connector P1/S1. The first connection or pin B1 on the lower row starts in the lower left corner of the connector P1/S1. The last connection or pin A49 on the upper row appears on the upper right corner of the connector P1/S1, and the last connection or pin B49 on the lower row appears on the lower right corner of the connector P1/S1. Connections or pins shown in solid black correspond to a ground connection. Due to the length of the connector P1/S1 and size constraints, some of the 98 connections or pins are not shown in the illustrated example. In this example, the last connection A49 on the A side, labeled P1 Seated, is used to detect whether the I/O edge connector P1 has been properly seated into the corresponding I/O connector socket S1. As described more fully below, this connection must be in an active state for the logic circuitry to bring the boards CB, GB, CGB into operational states.

On the short edge 600 (FIG. 6) of the board CB, there is a PCB connector socket S5 (see FIG. 7) that has pins arranged in two rows (upper and lower). For example, the PCB connector socket can be a 16-lane PCIe x16 socket having 164, 82 on the upper row and 82 on the lower row. The PCB socket connector S5 receives a corresponding PCB edge connector described in more detail below in connection with the gaming I/O board GB. The first pin (usually designated as A1 in the case of a PCIe x16 socket) on the upper row of the PCB socket connector (labeled P5 Top Seated) and the very last pin on the lower row (usually designated as B82 in the case of a PCIe x16 socket) (labeled P5 Bottom Seated) are both required to be in an active state (e.g., TTL high) to indicate that an edge connector of an external board (such as P5 of the gaming I/O board GB) has been properly seated into the PCB connector socket S5. In this example, the first pin A1 has been repurposed for determining whether the edge connector P5 of the board GB has been seated correctly into the socket S5 of the board CB. The logic requires both the first pin on the upper side A1 and the very last pin on the lower side B82 to be active for proper CB-GB board seating. Thus, the upper leftmost pin and the bottom rightmost pin are used to confirm proper board seating. If any board (including the GB board) is not properly seated, the board CB will not function. The logical requirements for bringing the boards CB, GB, CGB into operation states are described in more detail below.

Unlike the other edge connectors P1, P2, and P4, the socket S5 can be configured to carry signals that are specific to the gaming machine 10. At least one of the intermediate pins of the socket S5 communicates, under control of the CPU 30, a door signal related to a status of a door of the gaming machine 10 that houses the board CB.

As mentioned above, although the socket S5 is physically a standard PCIe x16 socket, not all of its pins are configured with the functionality defined in the PCIe bus standard. Those skilled in the art of PCB design will appreciate the details of the PCIe bus standard, and those details will not be repeated here. However, the PCIe x16 bus standard defines pinout definitions for all 164 pins. In this illustrated example, the first 98 pins of the 164 pins of the PCIe x16 socket S5 (corresponding to an 8-lane PCIe x8 socket), except for the first pin A1, are configured to carry conventional signals as defined by the PCIe x8 bus standard. The intermediate pin mentioned above that carries the door status signal is one of the latter 66 pins of the socket S5. In addition to the door status signal, other gaming-machine specific signals that can be carried by latter 66 pins of the socket PCIe x16 S5 include player tracking unit status that indicates a status of a player tracking unit, when present in the gaming machine 10.

FIG. 7 shows a functional diagram of exemplary locations of the connections or pins on the PCB edge connector P5 or its corresponding PCB connector socket S5. The topmost connections or pins appear on an upper row or "A" side of the edge/socket connector P5/S5, and the bottom connections or pins appear on a lower row or "B" side of the same edge/socket connector P5/S5. The first connection or pin A1 on the upper row starts on the upper left corner of the edge/socket connector P5/S5. The first connection or pin B1 on the lower row starts in the lower left corner of the connector P5/S5. The last connection or pin A82 on the upper row appears on the upper right corner of the connector P5/S5, and the last connection or pin B82 on the lower row appears on the lower right corner of the connector P5/S5. Connections or pins shown in solid black correspond to a ground connection. Due to the length of the connector P5/S5 and size constraints, some of the 164 connections or pins are not shown in the illustrated example. Again, in this example, the first connection A1 on the A side, labeled P5 Top Seated, and the very last connection B82 on the B side, labeled P5 Bottom Seated, are used to ensure that the socket S5 has been properly seated with the connector P5 before bringing the boards CB or GB into operational states.

The board CB, such as shown in FIG. 6, can have exactly three edge connectors, namely the power edge connector P4, the display edge connector P2, and the I/O edge connector P1, and having exactly one socket connector of a type that receives a corresponding edge connector, namely the PCB connector socket S5. Alternately or additionally, the board CB can lack on a major planar surface thereof any socket connectors that receive corresponding cable connectors connected to a cable. This means that there are no connectors anywhere on the major surface of the board CB that receive cable-carrying connectors. Any such connectors can be connected to the backplane BP, allowing the board CB/CGB to be a truly plug-and-play, as that term is understood by those skilled in the computer arts. Once the edge connectors P1, P2, P4 are seated properly and the optional P5 edge connector on the board GB is properly seated in the socket S5 (when the boards CB and GB are used together), no further connections are needed to allow the full range of functionality and communications capabilities of the board CB to be realized. Put differently, in this example, the only connections on the board CB to electrically and physically mate the board CB with the backplane BP consist of the edge connectors P1, P2, P4 and no other connectors. Likewise, the only connection on the board CB to electrically and physically mate the board CB with the board GB consists of the socket connector S5 and no other connector.

In the illustrated example shown in FIG. 6, along the long edge 602 from right to left, there is a PCIe x1 edge connector P4, followed in the middle by a PCIe x16 edge connector P2, and on the leftmost part of the board CB a PCIe x8 edge connector P1. These three connectors occupy nearly all of the available edge surface along the long edge 602. All three edge connectors are seated nearly simultaneously by pressing on the opposite long edge 610 of the board CB with a uniformly applied force along the opposite long edge 610 so that all three edge connectors P1, P2, P4 engage the corresponding socket connectors on the backplane BP simultaneously. The power edge connector P4 is positioned near the end of the board CB so that the electrical traces carrying power from a power supply external to the board CB do not intersect or create undesired coupling effects with other traces, such as those carry data signals such as multi-Gigahertz high-speed differential video signals. The traces carrying the differential video signals from the centrally located display edge connector P2 can go straight to the video display ports 502 without traversing much distance or PCB layers. As shown in FIG. 5, the video ports 502 are located immediately behind the display socket S2 so that the electrical traces from the socket S2 can go straight to the corresponding port of the video ports 502. Finally, the I/O edge connector P1 is located at a right angle to the socket S5 with no intervening connectors between the connector P1 and the socket S5, which permits I/O signals to be carried along traces that go directly between the socket S5 and the connector P1 without routing around other traces or components and without necessarily having to jump PCB layers. And, because non-PCIe standard signals (i.e., gaming-machine specific signals) are carried from the gaming I/O board GB in the latter 66 pins of the socket S5, which is the part of the socket S5 that is closest to the connector P1 (see FIG. 6), these signals can be routed directly to the corresponding I/O connection on the connector P1 without having to cross other traces.

Gaming I/O Board GB

The gaming I/O board GB optionally includes a CPU device like the CPU 30 (where the reference number 30 refers to one or more CPU devices). Alternately, the board GB can lack a CPU device. The board GB includes, along its short edge 612 (see FIG. 6), a backplane edge connector P3 having backplane connections to carry corresponding signals, such as low-speed signals, between the board GB and respective hardware components of the electronic gaming machine 10 that houses the board GB via the backplane BP. The backplane GB has a corresponding backplane socket connector S3 to receive the backplane edge connector (see FIG. 5). The hardware components can include any one or more of a coin interface, a coin-in meter, a coin-out meter, one or more lights in a top box of a cabinet 12 of the electronic gaming machine 10, one or more monitored doors of the electronic gaming machine 10, a slot arm, a slot arm lock, or one or more key switches.

Along its long edge 614, the board GB has an edge connector P5 with electrical connections (e.g., conductive pads or fingers; pins) arranged in two rows. When present, the long edge 614 of the board GB has approximately the same length as the short edge 600 of the board CB. The short edge 612 of the board GB, which is perpendicular to its long edge 614, is slightly longer than the edge connector P3. The board schematics shown in FIG. 6 provide examples of exemplary dimensions of the boards CB, GB. The board GB lacks any edge-facing socket connectors on a major surface of the board GB. For example, according to an aspect of the present disclosure, the only physical connectors to external systems on the board GB consists of the two edge connectors P3, P5. For example, the board GB can lack any socket connectors that receive a cable connector connected to a cable. In other words, the board GB can accept no cable connections anywhere on its surface, and instead, in this example, has only two edge connectors P3, P5. According to another aspect of the present disclosure, the board GB is plug-and-play, as that term is understood by those skilled in the computer arts.

Returning to the edge connector P5 on the board GB, (1) a first connection, such as pin A1, on an upper row (e.g., side "A") of the edge connector P5, and (2) the very last connection (e.g., the last pin) on a lower row (e.g., side "B") of the edge connector P5 are both required to be in an active state to indicate that the edge connector P5 has been properly seated into a connector socket S5 of an external printed circuit board, such as the board CB. Thus, if the edge connector P5 of the board GB were to be inserted crookedly into the corresponding socket connector S5 on the board CB, all functionality on the board GB is disabled according to an aspect of the present disclosure, though the board CB can continue to function and operate normally. The backplane edge connector P5 can be a 16-lane PCIe x16 edge connector. In the above example, the first connection can correspond to the first or pin A1 on the upper row of the PCIe x16 backplane edge connector P5, and the last connection can correspond to the 164th connection or pin B82 on the lower row of the PCIe x16 backplane edge connector P5. Repurposing the first and very last pin of the PCIe edge connector ensures that the boards GB and CB are properly seated with respect to one another before allowing signals to be provided between the board GB and the backplane BP. In other words, the first eight lanes (except the first pin) carry signals according to the PCIe x8 bus standard, but the latter eight lanes carry signals that do not necessarily conform with the PCIe bus standard.

As discussed above with respect to the socket connector S5 on the board CB, likewise the first 98 connections of the 164 connections of the PCIe x16 edge connector, except for the first connection, can be configured to carry signals as defined by the PCIe x8 bus standard. At least one of the intermediate connections (between the first and last connection) carries a door signal related to or indicative of a status of a door of the electronic gaming machine. This intermediate connection can be one of the latter 66 connections of the PCIe x16 edge connector when the 97 connections (e.g., pins) following the first connection are defined according to the PCIe x8 bus standard.

As described above, the backplane edge connector P3 includes backplane connections to carry corresponding signals between the board GB and respective hardware components of the electronic gaming machine 10 via the socket connector S3 on the backplane BP. These backplane connections of the backplane edge connector P3 on the board GB can include a cabinet-type connection that indicates a type of cabinet 12 of the electronic gaming machine 10. The type of cabinet can be, for example, slant or upright. The backplane connections can include serial connections for one or more serial ports associated with the electronic gaming machine 10. The backplane connections can include door-status connections that indicate a status of one of the one or more monitored doors and/or corresponding door locks of the electronic gaming machine 10. The door/lock status can include any combination of open, closed, locked, unlocked, or compromised. The backplane connections can include coin-interface connections that indicate information about or control the coin interface. The information can include a coin-in rate or throughput, and the control can include disabling or enabling the coin interface. The backplane connections can include connections for security logic control associated with security of the electronic gaming machine. The backplane connections can include meter-status connections indicating whether a coin-in meter or a coin-out meter of the gaming machine 10 is operating abnormally or is non-functioning.

FIG. 10 shows a functional diagram of exemplary locations of the connections or pins on the backplane edge connector P3 or its corresponding backplane connector socket S3. The topmost connections or pins appear on an upper row or "A" side of the edge/socket connector P3/S3, and the bottom connections or pins appear on a lower row or "B" side of the same edge/socket connector P3/S3. The first connection or pin A1 on the upper row starts on the upper left corner of the edge/socket connector P3/S3. The first connection or pin B1 on the lower row starts in the lower left corner of the connector P3/S3. The last connection or pin A82 on the upper row appears on the upper right corner of the connector P3/S3, and the last connection or pin B82 on the lower row appears on the lower right corner of the connector P3/S3. Connections or pins shown in solid black correspond to a ground connection. Due to the length of the connector P3/S3 and size constraints, some of the 164 connections or pins are not shown in the illustrated example. Like the edge connector P5, it can also be required that the first pin on the upper row (e.g., A1) and the last pin on the bottom row (e.g., B82) of the edge connector P3 be active before functionality is enabled on the board GB. The game-logic circuitry can require both proper seating of the connectors P3 and P5 before putting the board GB into a fully operational state. Examples of the logic can include the following. In the case of the PCBA shown in FIG. 4A, in which the CPU and gaming I/O functionality is provided on a single board CGB, the logic can require all the following connections to be in an active state before allowing the board CGB to be operational: A12 of P4 AND B1 of P2 AND A49 of P1 AND A1 of P3 AND B82 of P3. If any of these connections do not return an active state, the board CGB is not permitted to become operational. Due to the flexibility offered by having at least one connection on each connector/socket P1-P4/S1-S4 designated for reporting the seating state, the logic can be altered so that fewer of the connections are required to bring the board CGB into an operational state.

By way of another example, in the case of the PCBA shown in FIG. 4B, in which the CPU and gaming I/O functionality has been separated into multiple boards CB and GB, respectively, the logic can require all of the following connections to be in an active state before allowing either the board CB or the board GB to be operational: A12 of P4 AND B1 of P2 AND A49 of P1 AND A1 of P3 AND B82 of P3 AND A1 of P5 AND B82 of P5. Alternately, if the gaming I/O board GB is omitted, the logic can be as follows to eliminate the requirement that connector pair P3/S3 be seated: A12 of P4 AND B1 of P2 AND A49 of P1.

Backplane BP

The backplane BP is also a printed circuit board (PCB) and has a first (e.g., long) edge 504 perpendicular to a second (e.g., short) edge 506. The outer contour of the backplane BP can vary slightly as can be seen in FIG. 4A versus FIG. 4B, but in both cases the backplane BP has a longer edge and a shorter edge. The backplane BP has, along the first edge, four "female" socket connectors to receive the corresponding "male" edge connectors P4, P2, P1, P3 of the boards CB, GB, CGB. The backplane BP includes a power connector socket S4 on the first edge 504 at a corner section 512 of the backplane BP. The power connector socket S4 has a key 510 (best seen in the enlarged callout in FIG. 5). When the edge connector P4 is a PCIe x1 edge connector, the power socket connector S4 is a PCIe x1 socket connector. The power socket connector S4 thus includes the same corresponding connections as the edge connector P4 described above in connection with FIGS. 6 and 11. In short, on one side of the key 510, on both upper and lower rows, there are consecutively arranged power (e.g., +24V) pins, and on the other side of the key 510, there are consecutively arranged ground pins. No power and ground pins exist on the same side of the key 510, just as is the case for the corresponding power edge connector P4. The key notch 608 (FIG. 6) of any edge connector described herein fits over the corresponding key 510 of any socket connector described herein. When the edge and socket connectors are PCIe-type connectors, the dimensions and form factors of the key 510 and key notch 608 conform to the PCIe standard.

Next to the power connector socket S4, there is a display connector socket S2 on the first edge 504. There are no sockets between the power and display connector sockets S4, S2 on the backplane BP. The pinout definitions for the display connector socket S2 corresponds to the pinout definitions for the display edge connector P2 already described above. An example of the edge/socket connector P2/S2 can be seen in FIG. 8. For example, the display connector socket S2 has differential pairs of differential pins physically arranged on the display connector socket S2 such that at least one ground pin (shown in solid black in FIG. 8) exists between adjacent differential pairs of differential pins. Each of the differential pairs is configured to carry a video signal from the board CB to a corresponding video port 502 on the backplane BP.

Next to the display connector socket S2, there is an I/O connector socket S1 on the first edge 504. The I/O connector socket S1 has pins connected to respective traces directly leading to respective pins of the CPU 30 on the board CB. Next to the I/O connector socket S1, there is a backplane connector socket S3 on the first edge at an opposite corner section 514 of the backplane BP. The backplane socket connector S3 includes pins to carry corresponding signals, such as low-speed signals, between the board GB/CGB and respective hardware components of the electronic gaming machine 10.

The various boards can only be plugged into each other one way and in a certain order. For example, in embodiments in which the CB and GB boards are separate boards, first the edge connector P5 of the GB board must be seated into the corresponding connector socket S5 of the CB board, and then the four edge connectors P3, P1, P2, P4 are then inserted simultaneously into the corresponding connector sockets S3, S1, S2, S4 of the backplane BP. To swap out the GB board for a different GB board, such as one with enhanced or more limited functionality, both the GB and CB boards must be pulled out simultaneously from the corresponding sockets S1-S4, and then the existing GB board is separated from the CB board, and the new GB board plugged into the CB board before both the new GB board and CB board are plugged back into the backplane BP. This ensures that the board responsible for the most critical functionality specific to the gaming machine 10 is properly seated, together with the requirement that both the first pin on the upper row and the last pin on the bottom row of the connectors P5/S5 must be active to enable functionality on the GB board. As explained above, the seating logic using the designated connections for seating can further ensure that no board is put into an operational state until it has been properly seated relative to the backplane BP and/or to one other.

FIGS. 12-44 illustrate various aspects of the present disclosure, and their descriptions can be found in the above Brief Description of the Drawings. The broken lines shown in FIGS. 12-44 are only for illustrative purposes to show visible environmental structure and form no part of the claimed invention.

As discussed above, an advantage of the PCB assemblies described herein is that the electronics for a particular gaming machine 10 is modular and scalable to accommodate a wide variety of functionality and capabilities for different gaming machines 10. For example, the J102 receptacle header type connector shown in FIGS. 45 and 46 accepts an AC power cord 4700a, 4700b that is directly plugged into an electrical outlet without plugging into any intervening power supply between the gaming machine 10 and the electrical outlet. This is the only power cable connection required for the gaming machine 10, to power all of the electronics therein. The J102 receptacle header type connector is the only connector in the gaming machine 10 that receives a power cord 4700a, 4700b. As a result, any power cord rated for any appropriate jurisdiction can be connected to the connector J102. For example, in North America, a standard 120V AC plug 4700a can be connected to the cord that is plugged into the connector J102. By contrast, for gaming machines 10 used in Europe, a standard 240V AC plug 4700b can be connected to the cord that is plugged into the connector J102. Likewise, different power supply modules can be used, depending on the AC voltage requirements. In FIG. 49, two different power supply modules, PSM1 and PSM2, are shown, both of which can be plugged into the backplane BP (just not at the same time). For example, PSM1 can be configured as a power supply that receives a 120V AC power supply from the cord 4700*a*; whereas PSM2 can be configured as a power supply that receives a 240V AC power supply from the cord 4700*b*. Alternately, other power supply modules can be made for different power requirements. In FIG. 48, different DC power supply modules DCM1, DCM2 are shown. For example, the DC power conversion can be scaled up or down to support any DC service requirements, from 5V to 24V, for example. Different DC power supply modules DCM can be made for different service requirements, and plugged into the J33 socket on the backplane BP.

In FIG. 50, multiple fan modules, PVM1 and PVM2, are shown, which can be variously plugged into the backplane BP via the connector J68. For example, the fan module PVM1 can have fewer fans compared to the fan module PVM2, depending on the cooling requirements of the configuration of the game-logic circuitry 28, 400 of the gaming machine 10. Similarly, in FIG. 51, multiple CPU modules CPUM1, CPUM2 are shown. In this example, CPUM1 can house a single CGB board such as shown in FIG. 4A, whereas CPUM2 can house the boards CB and GB such as shown in FIG. 4B. The gaming machine manufacturer can make one backplane BP common to all gaming machines, and then select from a menu of modules and cords 4700 to customize a gaming machine with a particular configuration for a given application. The PCBA assemblies are thus highly modular and also highly scalable, allowing initial configurations to be upgraded or changed post-installation. One example of a fully assembled configuration is shown in FIG. 45, in which the backplane BP is shown connected to a power supply module PSM, a DC power supply module DCM, a fan module PVM, and a CPU module CPUM, which can house either the boards CB and GB or the board CGB. Again, the only power connection between the gaming machine 10 and an external electrical outlet (not shown) is made by connecting a power cord to the connector J102 from the electrical outlet. The power supply for the gaming machine 10 and/or the game-logic circuitry 28 is housed within the power supply module PSM. No power cord or cable is plugged into the power supply module PSM. The only connections for the PSM are made to the backplane BP. Likewise, in all of the modules shown, PSM, DCM, PVM, CPUM, the only connections external to the modules themselves are made to the backplane BP. No other external connections outside the modules are made. They are fully self-contained, and plug directly into one or more corresponding connections on the backplane BP. All power required by each module is supplied directly through the backplane BP, and not from an external power supply or power cord. The backplane BP also routes power to all of the other components of the gamine machine 10. In one example, there are no cables or cords routed from any electrical component or device (in this context, a "module" is distinguished from a "component" or "device") to any module shown or described herein. All such connections are made on the backplane BP itself, which facilitates the removal and installation of any module (PSM, DCM, PVM, CPUM) in any combination and in any order without disturbing the existing connections to components and devices inside the gaming machine 10. This reduces the likelihood of accidentally plugging a component or device into the wrong connector after unplugging. Installation of the cables to each of the components or devices inside the gaming machine is akin to a plug-once-and-forget procedure. Once a component or device is plugged in, there is no need to unplug it for servicing or upgrading any of the modules herein. If any module becomes defective or requires servicing, it can be readily swapped out for a new or upgraded one without having to unplug any cables or cords.

Each of these embodiments and obvious variations thereof is contemplated as falling within the spirit and scope of the claimed invention, which is set forth in the following claims. Moreover, the present concepts expressly include any and all combinations and sub-combinations of the preceding elements and aspects.

What is claimed is:

1. A printed circuit board (PCB) having a long edge next to a short edge, comprising:
   a central processing unit (CPU) device;
   a power edge connector on the long edge at a corner section of the PCB, the power edge connector having a key notch and a plurality of consecutively arranged power connections along an upper side and a lower side opposite the upper side of the power edge connector on one side of the key notch, the power edge connector having a plurality of consecutively arranged ground connections along the lower side and the upper side of the power edge connector on the other side of the key notch;
   a display edge connector on the long edge next to the power edge connector, the display edge connector having a plurality of differential pairs of differential connections physically arranged on the display edge connector such that at least one ground connection exists between adjacent differential pairs of differential connections, each of the differential pairs being configured to carry a video signal to one of a plurality of video ports external to the PCB; and
   an I/O edge connector on the long edge next to the display edge connector at an opposite corner section of the printed circuit board, the I/O edge connector having a plurality of connections connected to respective traces leading to respective pins of the CPU.

2. The PCB of claim 1, further comprising a PCB connector socket on the short edge of the PCB, the PCB connector socket having a plurality of pins arranged in two rows, where a first pin of the plurality of pins on one of the two rows and a last pin of the plurality of pins on the other of the two rows are both required to be in an active state to indicate that an edge connector of an external board has been properly seated into the PCB connector socket, and where the CPU is programmed to communicate via an intermediate pin of the plurality of pins a door signal related to a status of a door of an electronic gaming machine that houses the PCB.

3. The PCB of claim 2, where the PCB connector socket is a 16-lane Peripheral Component Interconnect Express (PCIe) x16 socket, and where the first and last pins correspond to the first and 164th pin of the PCIe x16 socket.

4. The PCB of claim 3, where the first 98 pins of the 164 pins of the PCIe x16 socket, except for the first pin, are configured to carry signals as defined by the PCIe x8 bus standard, and where the intermediate pin is one of the latter 66 pins of the PCIe x16 socket.

5. The PCB of claim 2, having exactly three edge connectors, namely the power edge connector, the display edge connector, and the I/O edge connector, and having exactly one socket connector of a type that receives a corresponding edge connector, namely the PCB connector socket.

6. The PCB of claim 1, where the number of differential pairs of differential connections supports up to three, or up to four, or up to five, or up to six, or up to seven, or up to eight, or up to nine video ports external to the PCB.

7. The PCB of claim 1, where the power edge connector, the display edge connector, and the I/O edge connector are Peripheral Component Interconnect Express (PCIe) type connectors.

8. The PCB of claim 7, where the power edge connector is a one-lane PCIe x1 connector, the display edge connector is a 16-lane PCIe x16 connector, and the I/O edge connector is an 8-lane PCIe x8 connector.

9. The PCB of claim 1, where the at least one ground connection between the adjacent differential pairs of differential connections provides a return for current passing through the differential connections and electrical isolation between the adjacent differential pairs of differential connections, and where the differential connections support high-speed signals oscillating on the order of multiple Gigahertz.

10. The PCB of claim 1, lacking on a major planar surface thereof any socket connectors that receive corresponding cable connectors connected to a cable that extends outside of a box housing the PCB, and being plug-and-play.

11. The PCB of claim 1, having exactly three edge connectors, namely the power edge connector, the display edge connector, and the I/O edge connector.

12. The PCB of claim 1, having exactly four edge connectors, namely the power edge connector, the display edge connector, the I/O edge connector, and a backplane edge connector, the backplane edge connector having a plurality of backplane connections to carry corresponding low-speed signals between the PCB and a respective plurality of hardware components of an electronic gaming machine that houses the PCB via a backplane having a corresponding backplane socket connector to receive the backplane edge connector.

13. A printed circuit board (PCB), comprising:
    a backplane edge connector having a plurality of backplane connections to carry corresponding low-speed signals between the PCB and a respective plurality of hardware components of an electronic gaming machine that houses the PCB via a backplane having a corresponding backplane socket connector to receive the backplane edge connector; and
    an edge connector having a plurality of connections arranged in two rows, where a first connection of the plurality of connections on one of the two rows and a last connection of the plurality of connections on the other of the two rows are both required to be in an active state to indicate that the edge connector has been properly seated into a PCB connector socket of an external printed circuit board, and where an intermediate connection of the plurality of connections carries a door signal related to a status of a door of the electronic gaming machine.

14. The PCB of claim 13, having a first edge perpendicular to a second edge, the backplane edge connector extending from the first edge and the edge connector extending from the second edge.

15. The PCB of claim 13, where the edge connector is a 16-lane Peripheral Component Interconnect Express (PCIe) x16 edge connector, and where the first and last connection of the plurality of connections correspond to the first and 164th connection of the PCIe x16 edge connector, respectively.

16. The PCB of claim 15, where each of the first 98 connections of the 164 connections of the PCIe x16 edge connector, except for the first connection, is configured to carry corresponding signals as defined by the PCIe x8 bus standard, and where the intermediate connection is one of the latter 66 connections of the PCIe x16 edge connector.

17. The PCB of claim 13, where the plurality of hardware components includes any two or more of a coin interface, coin-in meter, a coin-out meter, one or more lights in a top box of a cabinet of the electronic gaming machine, one or more monitored doors of the electronic gaming machine, a slot arm, a slot arm lock, or one or more key switches.

18. The PCB of claim 17, where the plurality of backplane connections include cabinet-type connections that indicate a type of cabinet of the electronic gaming machine.

19. The PCB of claim 17, where the plurality of backplane connections include serial connections for one or more serial ports.

20. The PCB of claim 17, where the plurality of backplane connections include door-status connections that indicate a status of one of the one or more monitored doors.

21. The PCB of claim 17, where the plurality of backplane connections include coin-interface connections that indicate information about or control the coin interface.

22. The PCB of claim 17, where the plurality of backplane connections include connections for security logic control associated with security of the electronic gaming machine.

23. The PCB of claim 17, where the plurality of backplane connections include meter-status connections indicating whether the coin-in meter or the coin-out meter is operating abnormally or non-functioning.

24. The PCB of claim 13, lacking on a major planar surface thereof any socket connectors that receive corresponding cable connectors connected to a cable, and being plug-and-play.

25. A printed circuit board (PCB) assembly that includes a backplane PCB having a first edge next to a second edge, the backplane PCB comprising:
    a power connector socket on the first edge at a corner section of the backplane PCB,
    the power connector socket having a key and a plurality of consecutively arranged power pins along an upper side and a lower side opposite the upper side of the power edge socket on one side of the key, the power connector socket having a plurality of consecutively arranged ground connections along the lower side and the upper side of the power connector socket on the other side of the key;
    a display connector socket on the first edge next to the power connector socket, the display connector socket having a plurality of differential pairs of differential pins physically arranged on the display connector socket such that at least one ground pin exists between adjacent differential pairs of differential pins, each of the differential pairs being configured to carry a video signal to a corresponding one of a plurality of video ports on the backplane PCB;
    an I/O connector socket on the first edge next to the display connector socket at an opposite corner section of the backplane PCB, the I/O connector socket having a plurality of pins connected to respective traces leading to respective pins of a CPU on an external backplane PCB; and
    a backplane connector socket having a plurality of backplane pins to carry corresponding low-speed signals between the backplane PCB and a respective plurality of hardware components of an electronic gaming machine that houses the backplane PCB.

26. The PCB assembly of claim 25, the PCB further comprising:
an AC power connector having a plurality of power contacts to receive an AC power cable carrying respective hot, neutral, and ground relative to an AC power source external to the PCB assembly;
an AC power connector; and
a DC power connector having a plurality of power contacts to receive respective DC power and ground relative to a DC power source, the DC power connector further having a plurality of signal contacts to receive at least status signals indicative of a status of the DC power source or another power source or both.

27. The PCB assembly of claim 26, wherein the AC power connector is of a receptacle header type.

28. A printed circuit board assembly, comprising:
a first printed circuit board (PCB) having a long edge next to a short edge, including:
  a central processing unit (CPU) device;
  a power edge connector on the long edge at a corner section of the first PCB, the power edge connector having a key notch and a plurality of consecutively arranged power connections along an upper side and a lower side opposite the upper side of the power edge connector on one side of the key notch, the power edge connector having a plurality of consecutively arranged ground connections along the lower side and the upper side of the power edge connector on the other side of the key notch;
  a display edge connector on the long edge next to the power edge connector, the display edge connector having a plurality of differential pairs of differential connections physically arranged on the display edge connector such that at least one ground connection exists between adjacent differential pairs of differential connections, each of the differential pairs being configured to carry a video signal to one of a plurality of video ports external to the first PCB; and
  an I/O edge connector on the long edge next to the display edge connector at an opposite corner section of the printed circuit board, the I/O edge connector having a plurality of connections connected to respective traces leading to respective pins of the first CPU;
a second PCB, including:
  a backplane edge connector having a plurality of backplane connections to carry corresponding low-speed signals between the second PCB and a respective plurality of hardware components of an electronic gaming machine that houses the second PCB via a backplane PCB having a corresponding backplane socket connector to receive the backplane edge connector; and
  an edge connector having a plurality of connections arranged in two rows, where a first connection of the plurality of connections on one of the two rows and a last connection of the plurality of connections on the other of the two rows are both required to be in an active state to indicate that the edge connector has been properly seated into a PCB connector socket of the first PCB, and where an intermediate connection of the plurality of connections carries a door signal related to a status of a door of the electronic gaming machine; and
the backplane PCB having a first backplane edge next to a second backplane edge, including:
  a power connector socket on the first backplane edge at a corner section of the backplane PCB,
  the power connector socket having a key and a plurality of consecutively arranged power pins along an upper side and a lower side opposite the upper side of the power edge socket on one side of the key, the power connector socket having a plurality of consecutively arranged ground connections along the lower side and the upper side of the power connector socket on the other side of the key;
  a display connector socket on the first backplane edge next to the power connector socket, the display connector socket having a plurality of differential pairs of differential pins physically arranged on the display connector socket such that at least one ground pin exists between adjacent differential pairs of differential pins, each of the differential pairs being configured to carry a video signal to a corresponding one of a plurality of video ports on the backplane PCB;
  an I/O connector socket on the first edge next to the display connector socket at an opposite corner section of the backplane PCB, the I/O connector socket having a plurality of pins connected to respective traces leading to respective pins of the CPU; and
  the backplane connector socket having a plurality of backplane pins to carry corresponding low-speed signals between the backplane PCB and the respective plurality of hardware components of the electronic gaming machine that houses the backplane PCB.

* * * * *